US011616002B2

(12) United States Patent
Lin et al.

(10) Patent No.: US 11,616,002 B2
(45) Date of Patent: Mar. 28, 2023

(54) THROUGH-CIRCUIT VIAS IN INTERCONNECT STRUCTURES

(71) Applicant: Taiwan Semiconductor Manufacturing Co., Ltd., Hsinchu (TW)

(72) Inventors: Jian-Hong Lin, Yunlin (TW); Hsin-Chun Chang, Taipei (TW); Ming-Hong Hsieh, Bade (TW); Ming-Yih Wang, Hsin-Chu (TW); Yinlung Lu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/162,584

(22) Filed: Jan. 29, 2021

(65) Prior Publication Data
US 2021/0375723 A1 Dec. 2, 2021

Related U.S. Application Data

(60) Provisional application No. 63/029,863, filed on May 26, 2020.

(51) Int. Cl.
*H01L 23/48* (2006.01)
*H01L 23/522* (2006.01)
(Continued)

(52) U.S. Cl.
CPC ...... *H01L 23/481* (2013.01); *H01L 21/76843* (2013.01); *H01L 21/76898* (2013.01); *H01L 23/5226* (2013.01); *H01L 23/5283* (2013.01)

(58) Field of Classification Search
CPC ....... H01L 23/00; H01L 23/48; H01L 23/522; H01L 23/528; H01L 23/481;
(Continued)

(56) References Cited

U.S. PATENT DOCUMENTS

2017/0200697 A1* 7/2017 Kao ............... H01L 25/0655
2018/0145011 A1 5/2018 Lin
(Continued)

FOREIGN PATENT DOCUMENTS

TW 201725696 A 7/2017

*Primary Examiner* — Chuong A Luu
(74) *Attorney, Agent, or Firm* — Sterne, Kessler, Goldstein & Fox P.L.L.C.

(57) ABSTRACT

An integrated circuit (IC) with through-circuit vias (TCVs) and methods of forming the same are disclosed. The IC includes a semiconductor device, first and second interconnect structures disposed on first and second surfaces of the semiconductor device, respectively, first and second interlayer dielectric (ILD) layers disposed on front and back surfaces of the substrate, respectively, and a TCV disposed within the first and second interconnect structures, the first and second ILD layers, and the substrate. The TCV is spaced apart from the semiconductor device by a portion of the substrate and portions of the first and second ILD layers. A first end of the TCV, disposed over the front surface of the substrate, is connected to a conductive line of the first interconnect structure and a second end of the TCV, disposed over the back surface of the substrate, is connected to a conductive line of the second interconnect structure.

20 Claims, 47 Drawing Sheets

(51) Int. Cl.
*H01L 21/768* (2006.01)
*H01L 23/528* (2006.01)

(58) Field of Classification Search
CPC .............. H01L 23/562; H01L 23/5226; H01L 23/5283; H01L 23/535; H01L 27/146; H01L 27/14636; H01L 21/768; H01L 21/76807; H01L 21/76843; H01L 21/76898; H01L 21/76808; H01L 27/1464; H01L 27/14634; H01L 21/76876; H01L 21/76879
USPC ........................................................ 257/773
See application file for complete search history.

(56) References Cited

U.S. PATENT DOCUMENTS

2020/0075459 A1* 3/2020 Zeng ................... H01L 23/3171
2020/0075483 A1* 3/2020 Zhou ................ H01L 23/53228

\* cited by examiner

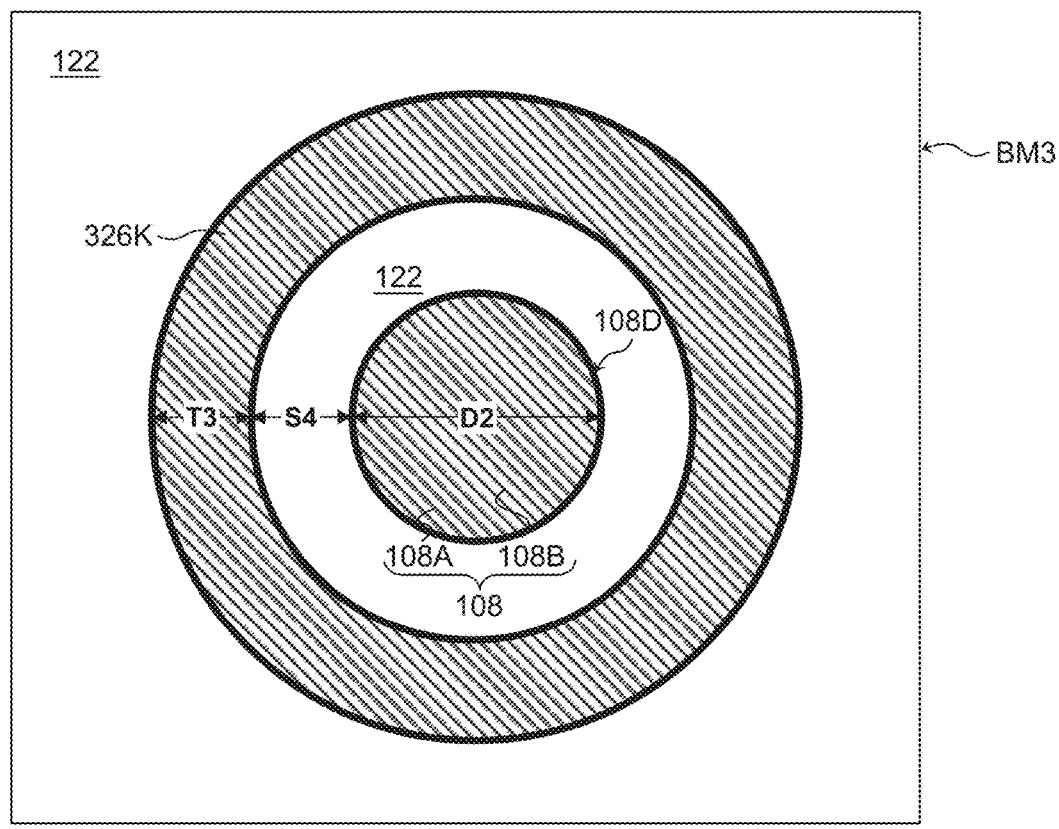
Fig. 7
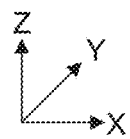

THROUGH-CIRCUIT VIAS IN INTERCONNECT STRUCTURES

CROSS-REFERENCE TO RELATED APPLICATIONS

This application claims the benefit of U.S. Provisional Patent Application No. 63/029,863, titled "Novel etching through OD big via structure and process for 2-side interconnect routing integrated chip," filed May 26, 2020, the disclosure of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, fin field effect transistors (finFETs), and Gate-all-around FETs (GAA FETs). Such scaling down has increased the complexity of semiconductor manufacturing processes.

BRIEF DESCRIPTION OF THE DRAWINGS

Aspects of this disclosure are best understood from the following detailed description when read with the accompanying figures.

FIGS. 1-9 illustrate cross-sectional views of an integrated circuit (IC) with different through-circuit vias (TCVs), in accordance with some embodiments.

Figure 1:
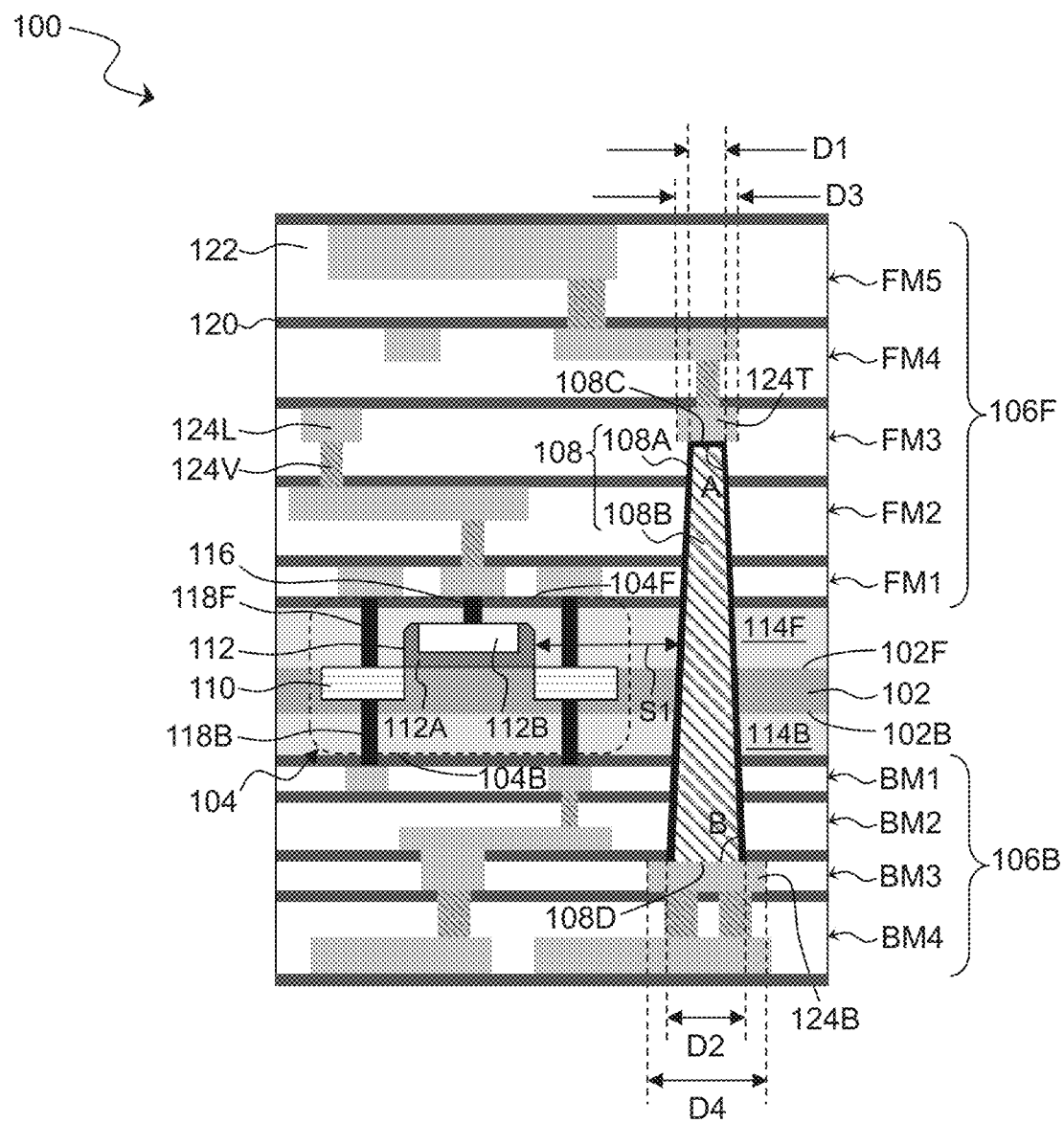

Illustrative embodiments will now be described with reference to the accompanying drawings. In the drawings, like reference numerals generally indicate identical, functionally similar, and/or structurally similar elements. The discussion of elements with the same annotations applies to each other, unless mentioned otherwise.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The present disclosure provides example integrated circuits (ICs) with through-circuit vias (TCVs) and provides methods of fabricating the same. In some embodiments, the TCVs can extend through front and back interconnect structures disposed on respective front- and back surfaces of semiconductor devices (e.g., FETs) in the ICs and can be disposed adjacent to the semiconductor devices. The TCVs provide highly conductive and flexible routing between the front and back interconnect structures compared to routing provided between the front and back interconnect structures through the semiconductor devices. With the use of the TCVs, routings in between front device structures (e.g., gate contact structures or front source/drain (S/D) contact structures), back device structures (e.g., back S/D contact structures), and front- and back-side IC elements (e.g., power lines and/or signal lines) can be more flexible than the routings in ICs without TCVs. As a result, the routings from the front and back device structures are not limited to the front- and back-side elements, respectively, as in the case of ICs without TCVs. Such flexible routings through the TCVs provide flexibility in designing power lines and/or signal lines on either sides of the ICs without being restricted by the arrangement of the front and back device structures of the semiconductor devices.

FIG. 1 illustrates a cross-sectional view of an IC 100, according to some embodiments. IC 100 can include a substrate 102, a semiconductor device 104 disposed on substrate 102, a front interconnect structure 106F disposed on a first surface 104F (also referred to as "front surface 110F") of semiconductor device 104, a back interconnect structure 106B disposed on a second surface 104B (also referred to as "back surface 104B") of semiconductor device 104 that is opposite to first surface 104F, and a TCV 108 extending through substrate 102 and front and back interconnect structures 106F and 106B along a Z-axis. Though one semiconductor device 104 and one TCV 108 is shown in FIG. 1, IC 100 can include any number of semiconductor devices and TCVs. In some embodiments, IC 100 can further include front-side elements (e.g., power lines or signal lines; not shown) and back-side elements (e.g., power lines or signal lines; not shown). The front-side and back-side elements can refer to elements disposed on or over front and back interconnect structures 106F and 106B, respectively.

Substrate 102 can be a semiconductor material, such as silicon, germanium (Ge), silicon germanium (SiGe), a silicon-on-insulator (SOI) structure, and a combination thereof. Substrate 102 can include a first surface 102F (also referred to as "front surface 102F") and a second surface 102B (also referred to as "back surface 102B") that is opposite to first surface 102F. In some embodiments, substrate 102 can have a thickness ranging from about 20 nm to about 500 nm. Below this range of thickness, substrate 102 may not be thick enough to form the elements (e.g., source/drain (S/D) regions 110) of semiconductor device 104. On the other hand, if substrate 102 is thicker than 500 nm, the time and cost of fabricating the elements (e.g., back S/D contact structures 118B) of semiconductor device 104 through back surface 102B increases.

Semiconductor device 104 can represent a finFET, a gate-all-around (GAA) FET, a MOSFET, or any other suitable FETs. In some embodiments, semiconductor device 104 can include S/D regions 110 disposed within front surface 102f, a gate structure 112 disposed on front surface 102F, front and back interlayer dielectric (ILD) layers 114F and 114B disposed on respective front and back surfaces 102F and 102B, a gate contact structure 116 disposed on gate structure 112, front S/D contact structures 118F disposed on S/D regions 110 through front ILD layer 114F, and back S/D contact structures 118B disposed on S/D regions 110 through back ILD layer 114B.

S/D regions 110 can include n- or p-type epitaxial regions with an epitaxially grown semiconductor material. In some embodiments, n-type epitaxial regions can include SiAs, SiC, or SiCP, and p-type epitaxial regions can include SiGe, SiGeB, GeB, SiGeSnB, or a III-V semiconductor compound. Gate structure 112 can be multi-layered structure and can include a high-k gate dielectric layer 112A and a conductive layer 112B. High-k gate dielectric layer 112A can include a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), and zirconium silicate ($ZrSiO_2$). Conductive layer 112B can include a suitable conductive material, such as tungsten (W), Ti, silver (Ag), ruthenium (Ru), molybdenum (Mo), copper (Cu), cobalt (Co), aluminum (Al), iridium (Ir), nickel (Ni), metal alloys, and a combination thereof.

Front and back ILD layers 114F and 114B can include an insulating material, such as silicon oxide, silicon nitride (SiN), silicon carbon nitride (SiCN), silicon oxycarbon nitride (SiOCN), and silicon germanium oxide. Gate contact structure 116 can be configured to electrically connect gate structure 112 to other elements (not shown) of IC 100 through front interconnect structure 106F. Similarly, front and back S/D contact structures 118F and 118B can be configured to electrically connect S/D regions 110 to other elements of IC 100 through front and back interconnect structures 106F and 106B, respectively. In some embodiments, gate contact structure 116 and front and back S/D contact structures 118F-118B can include conductive materials, such as Ru, Ir, Ni, Osmium (Os), rhodium (Rh), Al, Mo, W, Co, and Cu. In addition, highly conductive carbon structures, such as graphene (2D Hexagonal lattice made of carbon atoms) and carbon nanotube (1D Hexagonal lattice made of carbon atoms) can be used as the conductive materials of 118F-118B. The cross-sectional shape of semiconductor device 104 and its elements (e.g., gate structure 112, S/D regions 110, S/D contact structures 118F-118B, and/or gate contact structure 116) are illustrative and are not intended to be limiting. Semiconductor device 104 can include other elements, such as spacers, etch stop layers (ESLs), and capping layers that are not shown in FIG. 1 for simplicity.

Front and back interconnect structures 106F and 106B can be disposed on front and back surfaces 104F and 104B, respectively. In some embodiments, front interconnect structure 106F can include metallization layers FM1-FM5 and back interconnect structure 106B can include metallization layers BM1-BM4. Though five metallization layers FM1-FM5 and four metallization layers BM1-BM4 are discussed with reference to FIG. 1, front and back interconnect structures 106F and 106B can have any number of metallization layers. Each of metallization layers FM1-FM5 and BM1-BM4 can include an ESL 120 and an inter-metal dielectric (IMD) layer 122. ESLs 120 can include a dielectric material, such as aluminum oxide ($Al_xO_y$) nitrogen doped silicon carbide (SiCN), and oxygen doped silicon carbide (SiCO) with a dielectric constant ranging from about 4 to about 10. IMD layers 122 can include a low-k (LK) or extra low-k (ELK) dielectric material with a dielectric constant lower than that of silicon oxide (e.g., dielectric constant between 2 and 3.7). The LK or ELK dielectric material can reduce parasitic capacitances between metallization layers FM1-FM5 and BM1-BM4. In some embodiments, the LK or ELK dielectric material can include silicon oxycarbide (SiOC), nitrogen doped silicon carbide (SiCN), silicon oxycarbon nitride (SiCON), or oxygen doped silicon carbide.

In some embodiments, each of metallization layers FM1-FM5 and BM1-BM4 can further include one or more metal lines 124L (also referred to as "conductive lines 124L") and/or one or more metal vias 124V (also referred to as "conductive vias 124V"). Each of metal lines 124L can be disposed within IMD layer 122 and each of metal vias 124V can be disposed within IMD layer 122 and ESL 120. Metal vias 124V provide electrical connections (also referred to as "routings") between metal lines 120L of adjacent metallization layers. In some embodiments, metal lines 124L and metal vias 124V can include conductive materials, such as Cu, a Cu alloy (e.g., Cu—Ru, Cu—Al, or copper-manganese (CuMn)), and any other suitable metal or alloy. In some embodiments, metal lines 124L and metal vias 124V can include a metal liner (not shown) on which the conductive material is disposed. The metal liner can include metals, such as tantalum, cobalt, and other suitable metals, or metal nitrides, such as titanium nitride, tantalum nitride, and other suitable metal nitrides. Metal lines 124L and metal vias 124V of one or more of metallization layers FM1-FM5 and BM1-BM4 can be single damascene structures or dual-damascene structures.

The layout of metal lines 124L and metal vias 124V is exemplary and not limiting and other layout variations of metal lines 124L and metal vias 124V are within the scope of this disclosure. The number and arrangement of metal lines 124L and/or metal vias 124V in each of metallization layers FM1-FM5 and BM1-BM4 can be different from the ones shown in FIG. 1. The routings between semiconductor device 104 and metallization layers FM1-FM5 and BM1-BM4 are exemplary and not limiting. There may be routings between semiconductor device 104 and metallization layers FM1-FM5 and BM1-BM4 that are not visible in the cross-sectional view of FIG. 1.

TCV 108 can be disposed within front and back interconnect structures 106F and 106B, ILD layers 114F and 114B, and substrate 102. Though TCV 108 is shown in FIG. 1 to extend between metallization layer FM3 and metallization layer BM2, TCV 108 can extend between any number of metallization layers within front and back interconnect structures 106F and 106B. TCV 108 provides a conductive path between front and back interconnect structures 106F and 106B through ILD layers 114F and 114B, and substrate 102. As a result, routings in IC 100 between the front device structures (e.g., gate contact structure 116 or front S/D contact structures 118F), the back device structures (e.g., back S/D contact structures 118B), the front-side elements, and the back-side elements can be more flexible than the routings in ICs without TCV 108.

For example, unlike the ICs without TCV 108, routings in IC 100 can be formed between the front device structures of semiconductor device 104 and the back-side elements of IC 100 through TCV 108 and front and back interconnect structures 106F and 106B. Similarly, routings in IC 100 can be formed between the back device structures of semiconductor device 104 and the front-side elements of IC 100 through TCV 108 and front and back interconnect structures 106F and 106B. Thus, with the use of TCV 108, the routings from the front and back device structures are not limited to the front- and back-side elements, respectively, as in the case of ICs without TCV 108. In addition, such flexible routings in IC 100 lead to flexibility in designing the front- and back-side elements of IC 100. For example, the power lines and/or signal lines of IC 100 can be formed as front- or back-side elements without being restricted by the arrangement of the front and back device structures of semiconductor device 104. Though FIG. 1 does not show semiconductor device 104 connected to TCV 108, the routings from semiconductor device 104 to TCV 108 through front and back interconnect structures 118F and 118B may not be visible in the cross-sectional view of FIG. 1, but may be visible in other cross-sectional views (not shown) of IC 100.

In some embodiments, TCV 108 can include a liner 108A and a conductive plug 108B disposed on liner 108A. Liner 108A can act as an adhesion promotor for the material of conductive plug 108B. In addition, liner 108A can prevent the diffusion of materials from conductive plug 108B to adjacent structures (e.g., ESLs 120, IMD layers 122, substrate 102, or ILD layers 114F-114B) and/or the diffusion of materials from the adjacent structures to conductive plug 108B. In some embodiments, liner 108A can include a conductive material, such as Ta, Ti, Co, W, Ru, alloys of Ta, Ti, Co, W, Ru, and combinations thereof. In some embodiments, conductive plug 108B can include a conductive material, such as Cu, W, Ti, Ta, Al, Co, Ru, alloys of Cu, W, Ti, Ta, Al, Co, Ru, and combinations thereof. In some embodiments, the conductive material of liner 108A can be similar to or different from the conductive material of conductive plug 108B. In some embodiments, the conductive materials of liner 108A and/or conductive plug 108B can be similar to or different from the conductive materials of metal lines 124L and/or metal vias 124V.

TCV 108 can have a tapered structure with a first end 108C (also referred to as "top end 108C") and a second end 108D (also referred to as "base end 108D") that is wider than first end 108C. In addition, the tapered structure can have an angle A between first end 108C and a sidewall of TCV 108, and an angle B, smaller than angle A, between second end 108D and the sidewall of TCV 108. First end 108C can have a diameter (or a width) D1 along an X-axis and second end 108D can have a diameter (or a width) D2 along an X-axis that is about 1.5 times to about 20 times greater than diameter D1. In some embodiments, diameter D1 can range from about 20 nm to about 1.5 μm and diameter D2 can range from about 30 nm to about 30 μm.

In some embodiments, the dimensions of first end 108C and second end 108D can depend on a dimension or the smallest dimension, along an X- or Y-axis, of S/D contact structures 118F-118B. For example, if a dimension or the smallest dimension, along an X- or Y-axis, of S/D contact structures 118F-118B is W1, the ratio of D2:W1 can range from about 1:1 to about 50:1. In some embodiments, the dimensions of first end 108C and second end 108D can depend on a dimension or the smallest dimension, along an X- or Y-axis, of metal lines 124L that are in direct contact with S/D contact structures 118F-118B. For example, if a dimension or the smallest dimension, along an X- or Y-axis, of metal lines 124L in metallization layers FM1 and/or BM1 is W2, the ratio of D2:W2 can range from about 1:1 to about 50:1. These dimensions and/or relative dimensions of TCV 108 provide an adequate structure for the conductive path between front and back interconnect structures 106F and 106B. Below these dimensions and/or relative dimensions of TCV 108, a conductive path with adequate conductivity may not be formed between front and back interconnect structures 106F and 106B, and consequently, degrade the circuit performance. On the other hand, if TCV 108 is formed outside these dimensions and/or relative dimensions, the cost of manufacturing IC 100 with TCV 108 increases.

In some embodiments, TCV 108 can be spaced apart from gate structure 112 by a distance Si along an X-axis to minimize parasitic capacitance between TCV 108 and semiconductor device 104. Distance Si can be about 3 times to about 50 times greater than diameter D2. In some embodiments, each of first and second ends 108C and 108D can be in direct contact with a metal line in respective metallization layers in which first and second surfaces 108C and 108D are disposed. For example, first and second ends 108C and 108D are disposed in respective metallization layers FM3 and BM2, and can be in direct contact with metal lines 124T and 124B (also referred to as "conductive lines 124T and 124B") in metallization layers FM3 and BM2, respectively. The discussion of metal lines 124L applies to metal lines 124T and 124B, unless mentioned otherwise. In some embodiments, TCV 108 and metal lines 124T and 124B can be formed as single damascene structures. Metal lines 124T and 124B can have widths D3 and D4, respectively, along an X-axis. The ratio of D1:D3 can range from about 1:1 to about 1:10 and the ratio of D2:D4 can range from about 1:1 to about 1:10 for adequate conductivity between TCV 108 and metal lines 124T and 124B.

Figure 2:
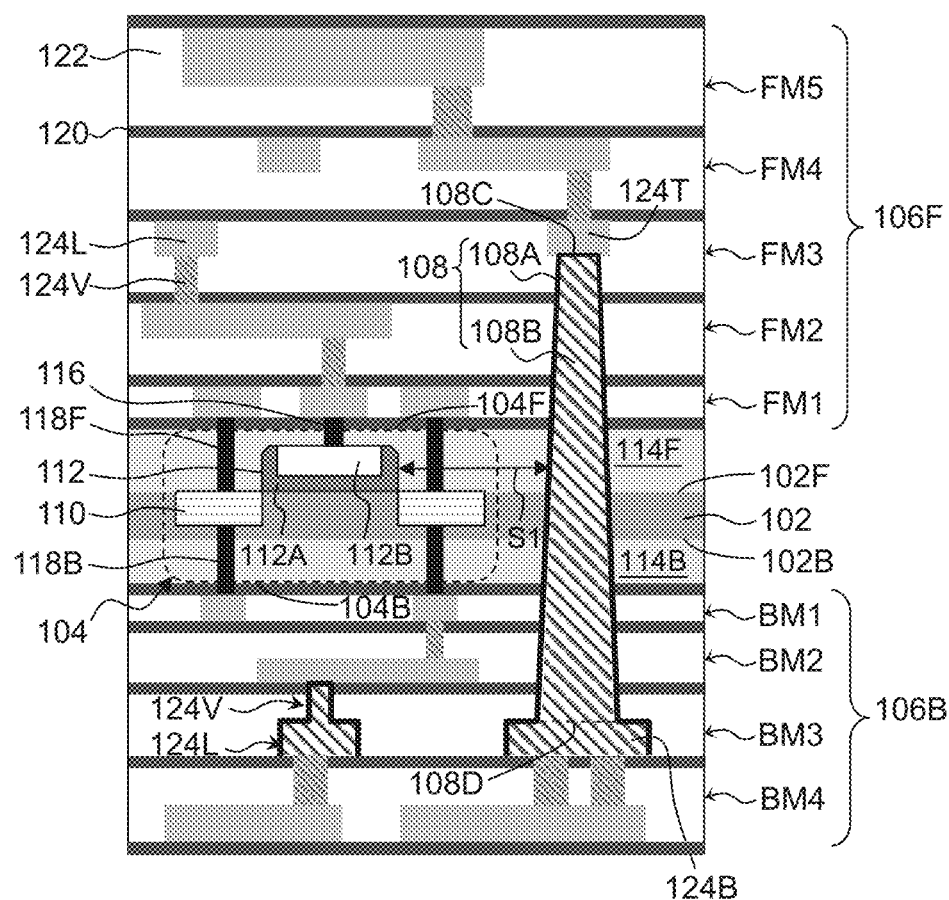

FIG. 2 illustrates a cross-sectional view of an IC 200, according to some embodiments. The discussion of IC 100 applies to IC 200, unless mentioned otherwise. The discussion of elements in FIGS. 1-2 with the same annotations applies to each other, unless mentioned otherwise. In IC 200, TCV 108 can extend between metallization layers FM3 and BM3, and TCV 108 and metal line 124B can be a dual damascene (DD) structure, instead of the single damascene structures shown in IC 100 of FIG. 1. In some embodiments, if TCV 108 and metal line 124B are a DD structure (referred to as "DD structure 2566" in FIG. 25), other metal lines and metal vias in the metallization layer in which second end 108D of TCV 108 is disposed are DD structures. For example, metal line 124L and metal via 124V of metallization layer BM3, in which second end 108D is disposed, is a DD structure.

Figure 3:
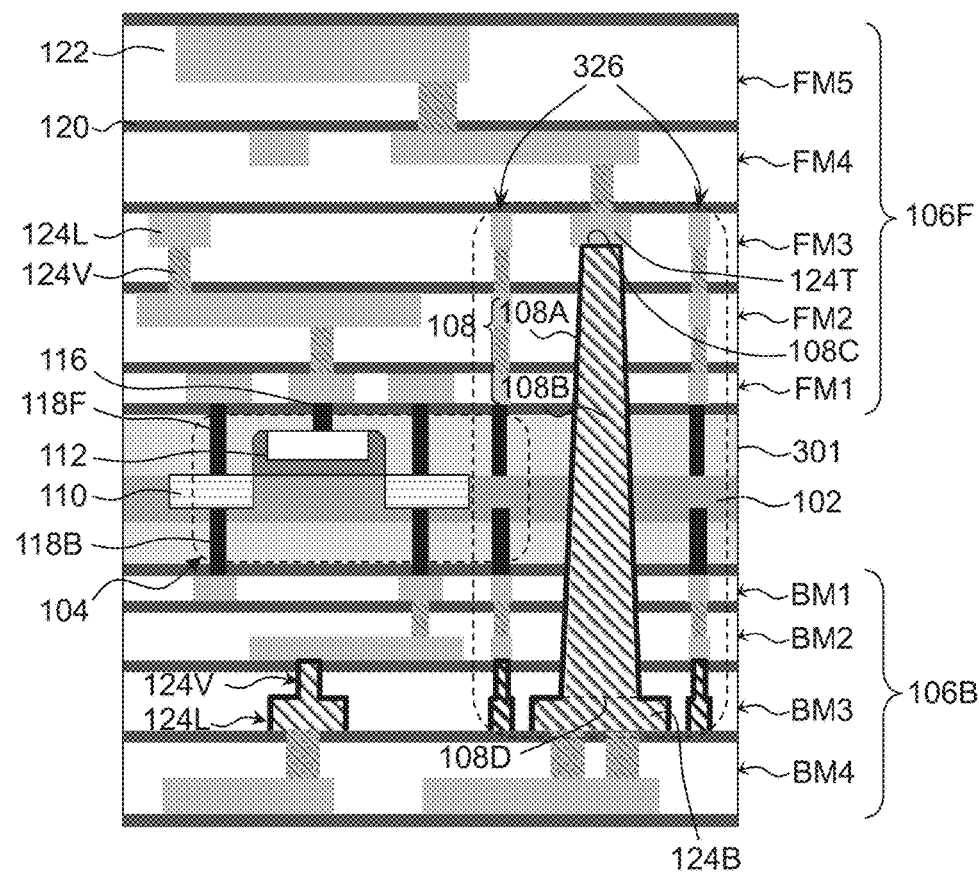
Figure 4:
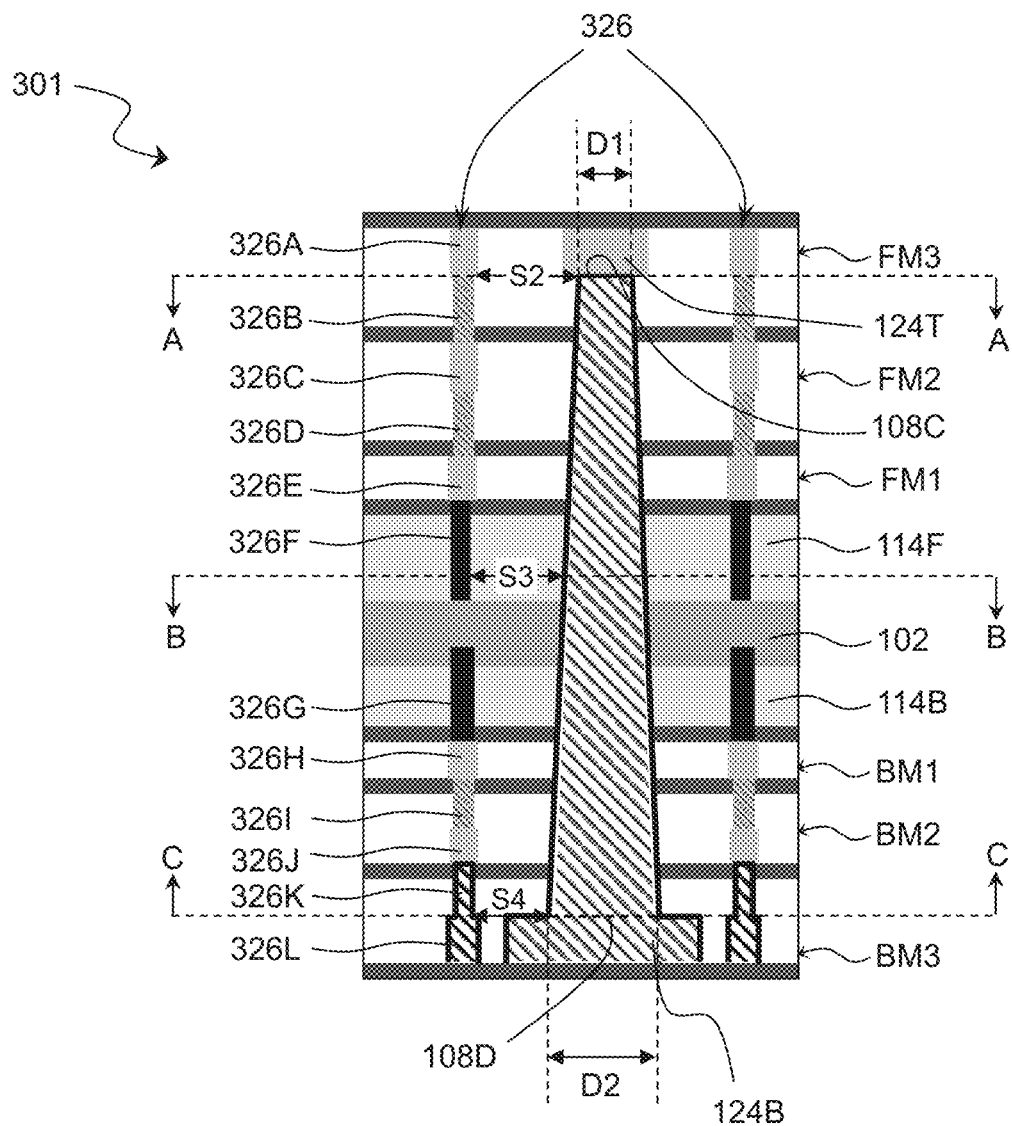
Figure 5:
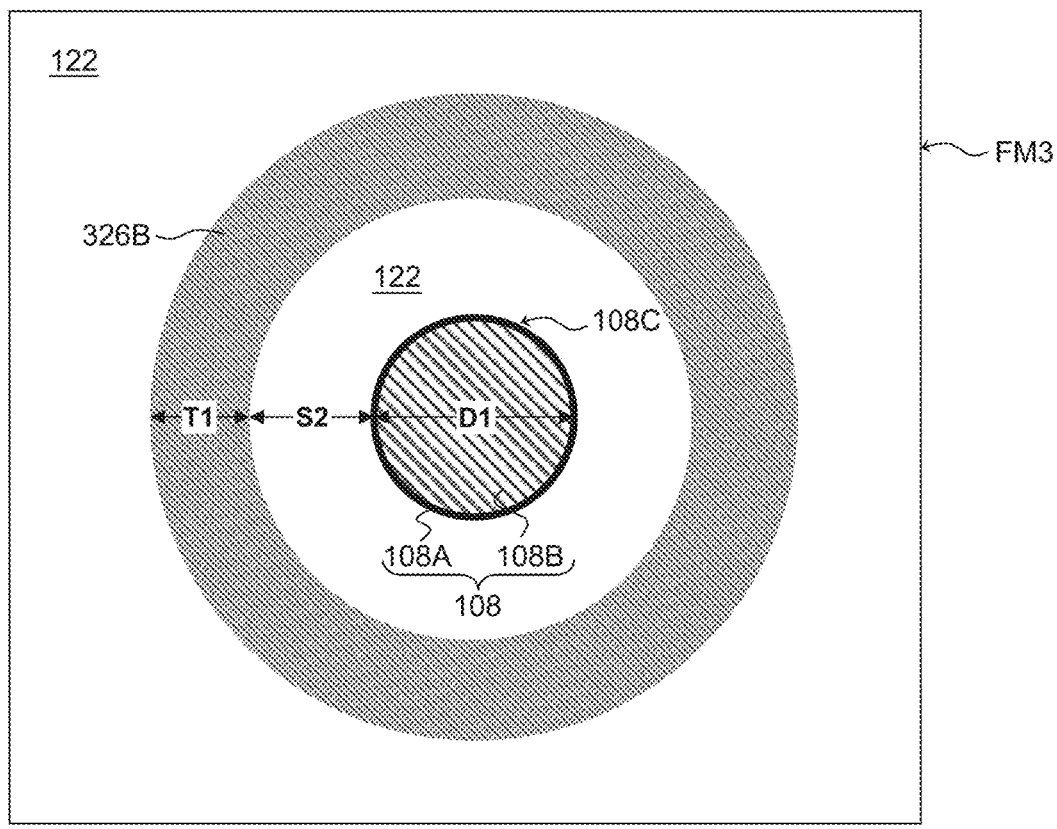
Figure 6:
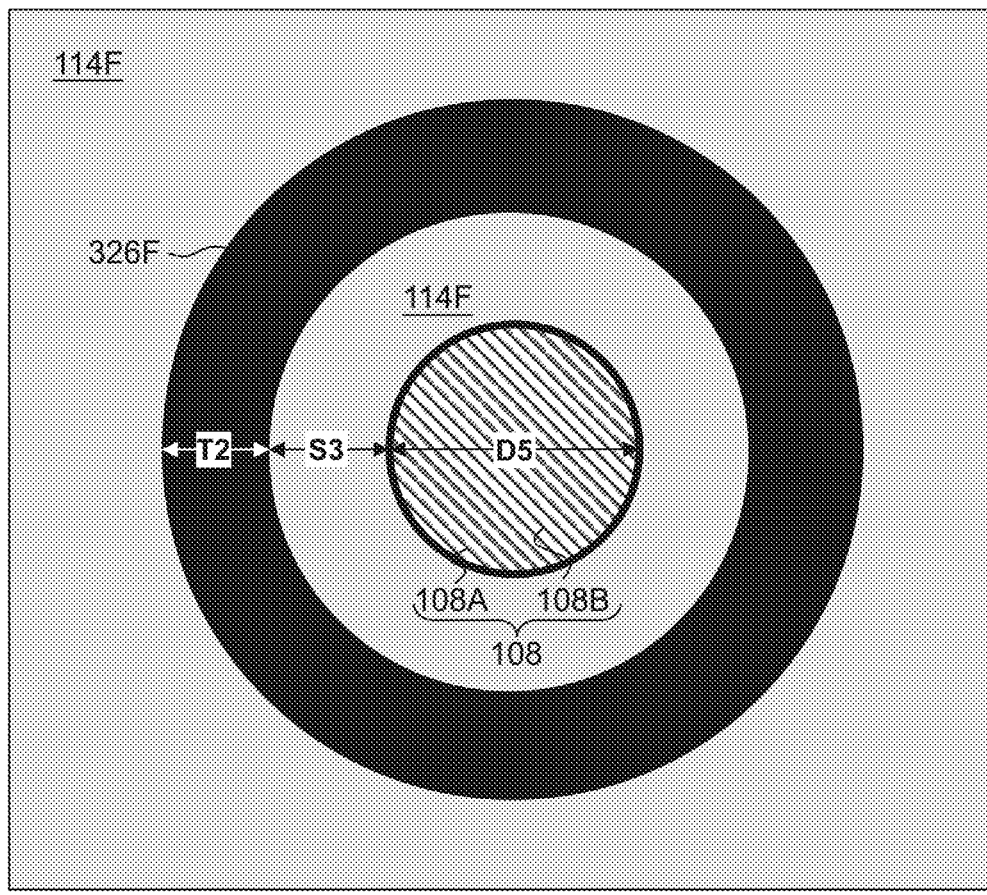

FIG. 3 illustrates a cross-sectional view of an IC 300, according to some embodiments. FIG. 4 illustrates an enlarged view of region 301 in FIG. 3 of IC 300, according to some embodiments. FIGS. 5-7 illustrate cross-sectional views along lines A-A, B-B, and C-C in FIG. 4. The discussion of IC 200 applies to IC 300, unless mentioned otherwise. The discussion of elements in FIGS. 1-7 with the same annotations applies to each other, unless mentioned otherwise.

Referring to FIGS. 3-4, IC 300 can include a barrier structure 326 surrounding TCV 108 and metal lines 124T-124B. Barrier structure 326 can be configured to protect elements (e.g., semiconductor device 104, metal lines 124L of metallization layers FM1-FM3 and BM1-BM3, and/or metal vias 124V of metallization layers FM2-FM3 and BM2-BM3) of IC 300 adjacent to TCV 108 during the fabrication of TCV 108. For example, barrier structure 326 can prevent etchants and/or moisture from diffusing into the adjacent elements, consequently damaging the adjacent elements during a wet etching process of TCV 108. Barrier structure 326 can include a stack of barrier layers 326A-326L. Barrier layer 326A surrounds metal line 124T, the stack of barrier layers 326B-326K surrounds TCV 108, and barrier layer 326L surrounds metal line 124B. Each of barrier layers 326A-326L can have a dimension (e.g., height) along a Z-axis and material similar to the corresponding adjacent metal line 124L, metal via 124V, or S/D contact structures 118F-118B that is not surrounded by barrier layer 326A-326L.

For example, the height and material of (i) barrier layers 326A and 326B can be similar to that of respective metal line 124L and metal via 124V of metallization layer FM3, (ii) barrier layers 326C and 326D can be similar to that of respective metal line 124L and metal via 124V of metallization layer FM2, (iii) barrier layer 326E can be similar to that of metal line 124L of metallization layer FM1, (iv) barrier layers 326F and 326G can be similar to that of respective S/D contact structure 118F and 118B, (v) barrier layer 326H can be similar to that of metal line 124L of metallization layer BM1, (vi) barrier layers 326I and 326J can be similar to that of respective metal line 124L and metal via 124V of metallization layer BM2, and (vii) barrier layers 326K and 326L can be similar to that of respective metal line 124L and metal via 124V of metallization layer BM3. In some embodiments, the dimensions (e.g., thickness) of barrier layers 326A-326L along an X-axis can be equal to or different from each other. In some embodiments, the thicknesses of barrier layers 326A-326L can range from about 0.5 nm to about 10 µm. If the thicknesses are below 0.5 nm, barrier layers 326A-326L may not provide adequate protection to the elements of IC 300 adjacent to TCV 108 during the fabrication of TCV 108. On the other hand, if the thicknesses are above 10 µm, the processing time for the fabrication of barrier layers 326A-326L increases, and consequently, increases IC manufacturing cost. In some embodiments, each of barrier layers 326A-326L can be spaced apart from TCV 108 along an X-axis by a distance that is equal to or greater than diameters D1-D2 of TCV 108.

In some embodiments, each of barrier layers 326A-326L can have an annular cross-section, along an XZ-plane, surrounding TCV 108 with a circular cross-section along an XZ-plane, as shown for barrier layers 326B, 326F, and 326K in FIGS. 5-7. Though barrier layers 326B, 326F, and 326K are shown to have annular cross-sections with a circular geometry in FIGS. 5-7, barrier layers 326A-326L can have annular cross-sections with rectangular, oval, polygonal, or any other suitable geometry. Similarly, instead of the circular cross-section shown for TCV 108 in FIGS. 5-7, TCV 108 can have cross-sections of other geometric shapes (e.g., rectangular, oval, polygonal, etc.).

Referring to FIGS. 5-7, thicknesses T1, T2, and T3 of respective barrier layers 326B, 326F, and 326K along an X-axis can be equal to or different from each other and can range from about 0.5 nm to about 10 µm. In some embodiments, each of the inner diameters of barrier layers 326B, 326F, and 326K along an X-axis can be about 2 times to about 20 times greater than diameter D1, D2, or D5 of TCV 108. Diameter D5 can be greater than diameter D1 and smaller than diameter D2 due to the tapered structure of TCV 108. Barrier layers 326B, 326F, and 326K can be spaced apart from TCV 108 along an X-axis by a distance S2, S3, and S4, respectively. Distance S2 can be greater than distance S3, which can be greater than distance S4 due to the tapered structure of TCV 108. In some embodiments, each of the ratios of S2:D1, S2:D2, S2:D5, S3:D1, S3:D2, S3:D5, S4:D1, S4:D2, and S4:D5 can range from about 1:1 to 20:1. The discussion of thicknesses T1-T3 and distances S2-S3 can apply to any of barrier layers 326A-326L.

Figure 8:
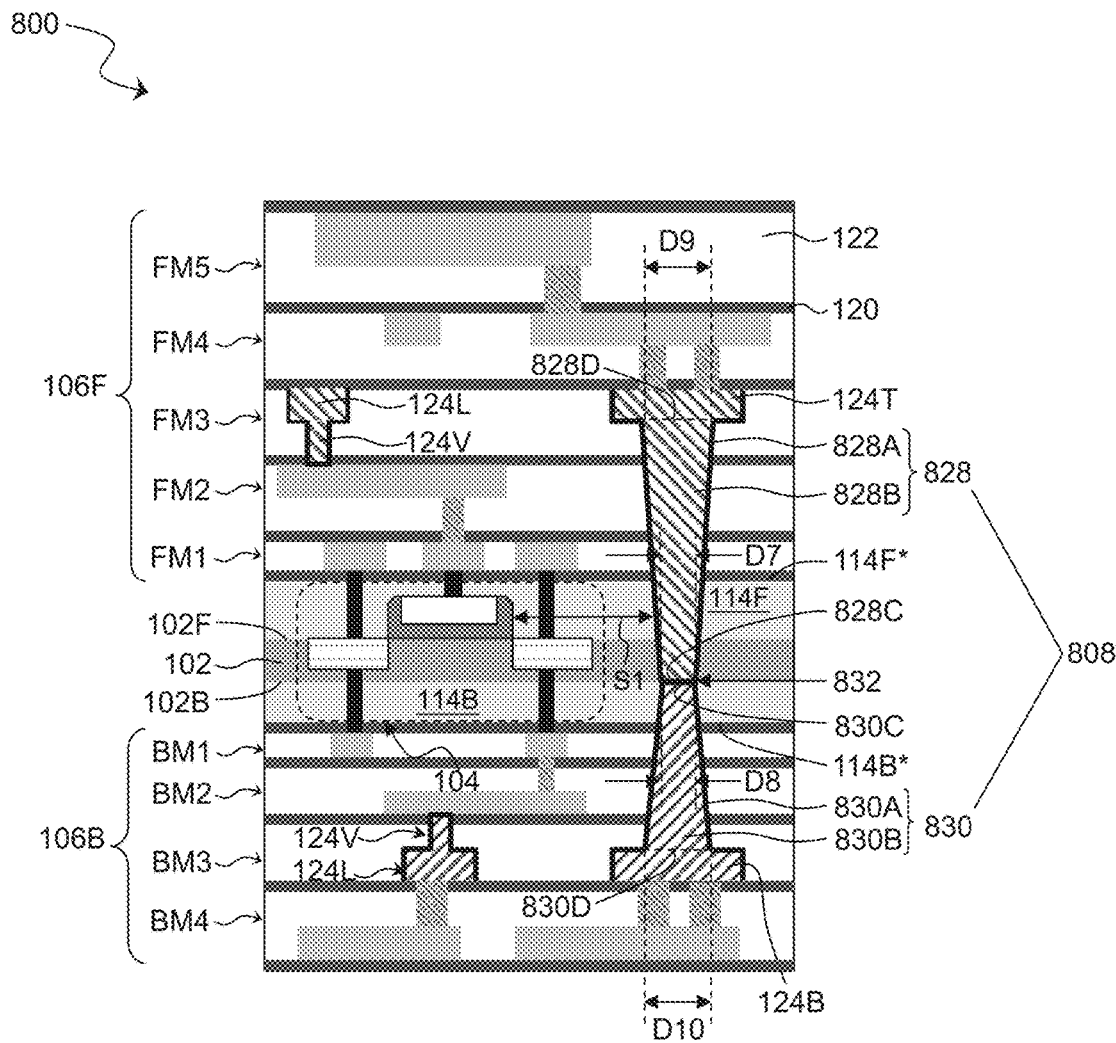

FIG. 8 illustrates a cross-sectional view of an IC 800, according to some embodiments. The discussion of IC 200 applies to IC 800, unless mentioned otherwise. The discussion of elements in FIGS. 1-8 with the same annotations applies to each other, unless mentioned otherwise. In some embodiments, IC 800 can include a TCV 808. The discussion of TCV 108 applies to TCV 808, unless mentioned otherwise. TCV 808 can include a stack of TCVs 828 and 830 with an interface 832 between TCVs 828 and 830 at back surface 102B. In some embodiments, TCV 828 can be disposed within front interconnect structure 106F, front ILD layer 114F, and substrate 102, and TCV 830 can be disposed within back interconnect structure 106B and back ILD layer 114B. Though TCV 828 is shown to extend between metallization layers FM1-FM3, and TCV 830 is shown to extend between metallization layers BM1-BM3, TCVs 828 and 830 can extend between any number of metallization layers within front and back interconnect structures 106F and 106B, respectively. Similarly, though interface 832 is shown to be at back surface 102B, interface 832 can be at top surface 114F* of front ILD layer 114F, front surface 102F, or back surface 114B* of back ILD layer 114B.

TCV 828 can include a liner 828A and a conductive plug 828B disposed on liner 828A and TCV 830 can include a liner 830A and a conductive plug 830B disposed on liner 830A. The discussion of liner 108A applies to liners 828A-830A and the discussion of conductive plug 108B applies to conductive plugs 828B-830B. Similar to TCV 108, TCVs 828 and 830 can be tapered structures with first ends 828C-830C and second ends 828D-830D that are wider than first ends 828C-830C. First ends 828C-830C can have respective diameters (or widths) D7-D8 along an X-axis and second ends 828D-830D can have respective diameters (or widths) D9-D10 along an X-axis. The discussion of diameter D1 of TCV 108 applies to diameters D7-D8 and the discussion of diameter D2 of TCV 108 applies to diameters D9-D10. In some embodiments, diameters D7-D8 can be equal to or different from each other and diameters D9-D10 can be equal to or different from each other.

In some embodiments, each of second ends 828D and 830D can be in direct contact with a metal line in respective metallization layers in which second surfaces 828D and 830D are disposed. For example, second ends 828D and 830D are disposed in respective metallization layers FM3 and BM3, and can be in direct contact with metal lines 124T and 124B in metallization layers FM3 and BM3, respectively. In some embodiments, TCV 828 and metal line 124T can be formed as a DD structure (referred to as "DD structure 3666" in FIG. 36) or as single damascene structures (not shown). In some embodiments, TCV 830 and metal line 124B can be formed as a DD structure (referred to as "DD structure 4066" in FIG. 40) or as single damascene structures (not shown).

Figure 9:
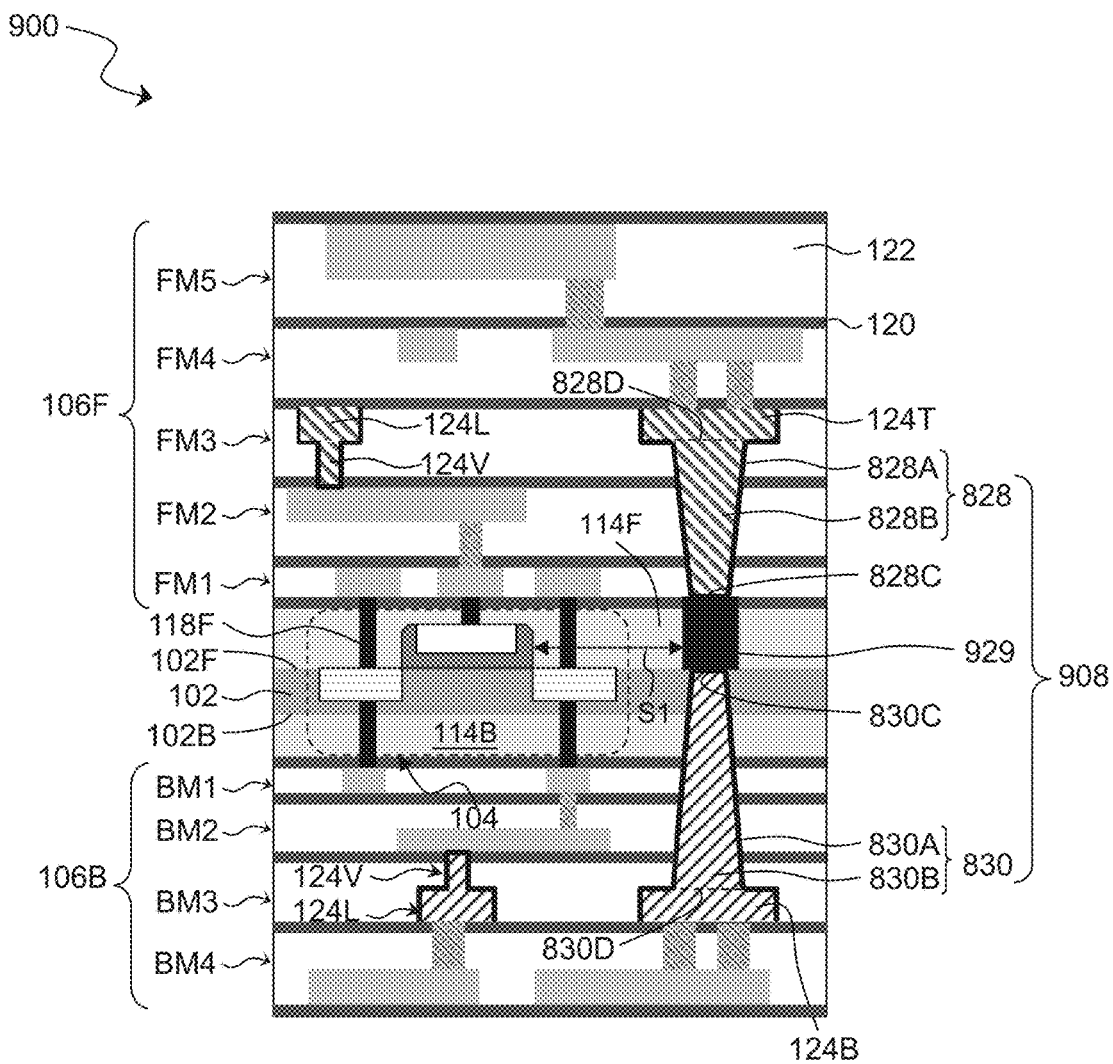

FIG. 9 illustrates a cross-sectional view of an IC 900, according to some embodiments. The discussion of IC 800 applies to IC 900, unless mentioned otherwise. The discussion of elements in FIGS. 1-9 with the same annotations applies to each other, unless mentioned otherwise. In some embodiments, IC 900 can include a TCV 908 with a stack of TCVs 828 and 830 and a conductive pad 929 disposed between TCVs 828 and 830. In some embodiments, conductive pad 929 can be disposed within front ILD layer 114F and can be aligned with front S/D contact structures 118F along an X-axis, as shown in FIG. 9. In some embodiments, conductive pad 929 can be disposed within back ILD layer 114B, instead of within front ILD layer 114F, and can be aligned with back S/D contact structures 118B along an X-axis (not shown). If conductive pad 929 is aligned with front S/D contact structures 118F, conductive pad 929 can have a dimension (e.g., height) along a Z-axis and material similar to front S/D contact structures 118F. If conductive pad 929 is aligned with back S/D contact structures 118B, conductive pad 929 can have a dimension (e.g., height) along a Z-axis and material similar to back S/D contact structures 118B.

In some embodiments, similar to IC 300, ICs 800 and 900 can have barrier structure 326 surrounding TCVs 808 and 908, respectively.

Figure 10:
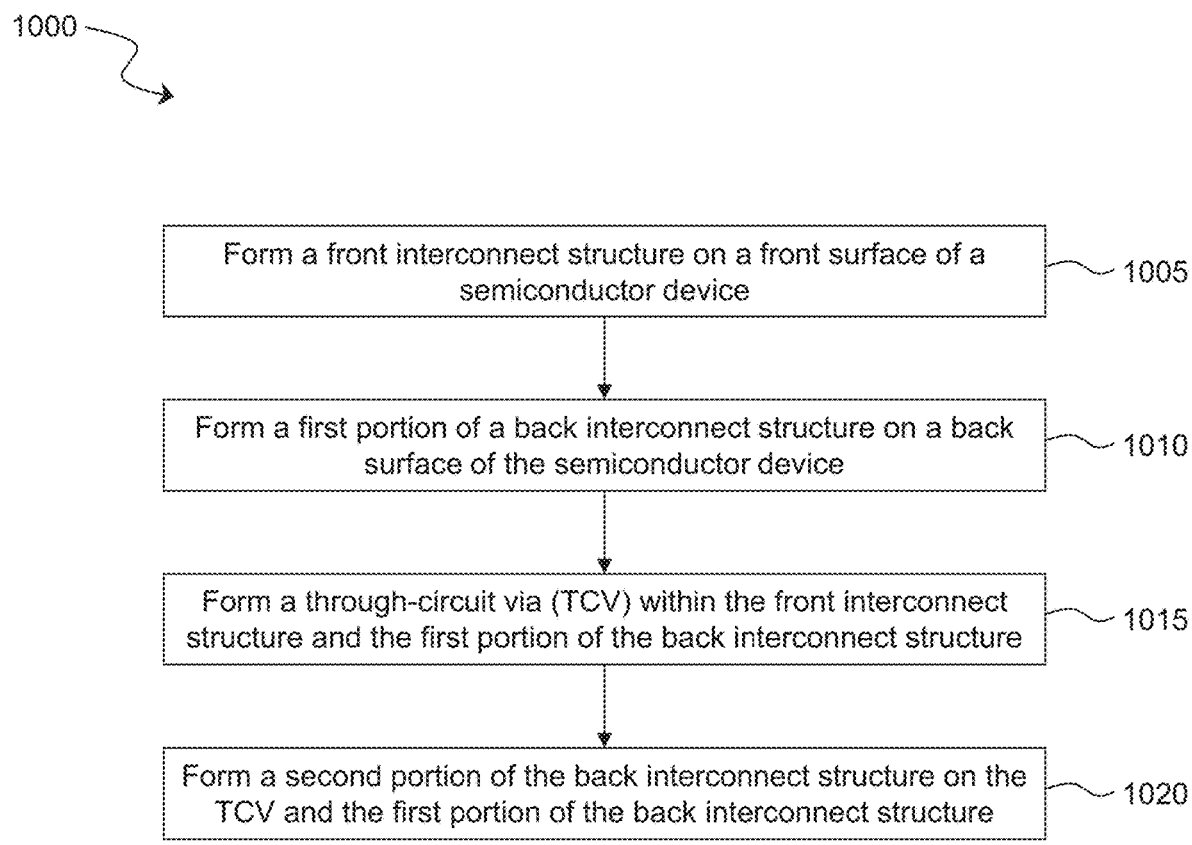
FIG. 10 is a flow diagram of a method for fabricating an IC with a TCV, in accordance with some embodiments.

FIG. 10 is a flow diagram of an example method 1000 for fabricating IC 100, according to some embodiments. For illustrative purposes, the operations illustrated in FIG. 10 will be described with reference to the example fabrication process for fabricating IC 100 as illustrated in FIGS. 11-15. FIGS. 11-15 are cross-sectional views of IC 100 at various stages of fabrication, according to some embodiments. Operations can be performed in a different order or not performed depending on specific applications. It should be noted that method 1000 may not produce a complete IC 100. Accordingly, it is understood that additional processes can be provided before, during, and after method 1000, and that some other processes may only be briefly described herein. Elements in FIGS. 11-15 with the same annotations as elements in FIGS. 1-9 are described above.

Figure 11:
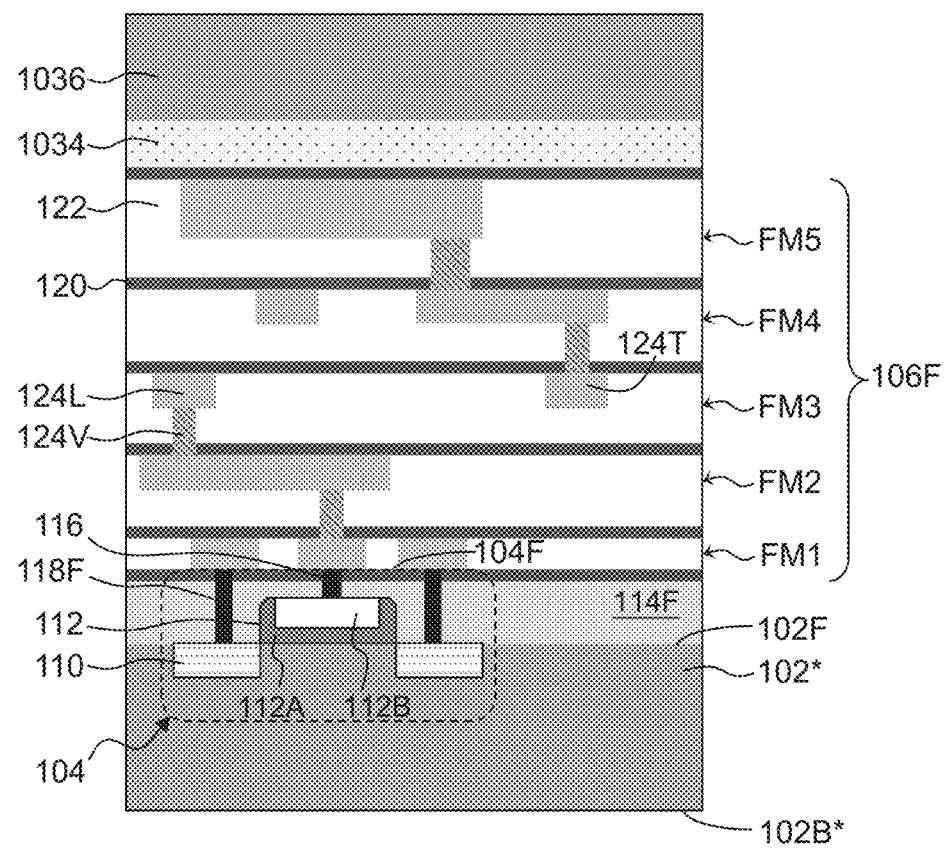
FIGS. 11-15 illustrate cross-sectional views of an IC with a TCV at various stages of its fabrication process, in accordance with some embodiments.

In operation 1005, a front interconnect structure is formed on a front surface of a semiconductor device. For example, as shown in FIG. 11, front interconnect structure 106F is formed on front surface 104F of semiconductor structure 104, which is formed on front surface 102F of substrate 102*. In some embodiments, metal lines 124L and metal vias 124V of metallization layers FM2-FM5 can be formed by a single damascene process or a dual damascene process. The formation of front interconnect structure 106F can be followed by sequential operations of (i) depositing a bonding layer 1034 on ESL 120 of metallization layer FM5 and (ii) bonding a carrier substrate 1036 on bonding layer 1034. The bonding process can include direct bonding, optical fusion bonding, anodic bonding, or other suitable bonding process. In some embodiments, bonding layer 1034 can include an insulating material and carrier substrate 1036 can include a semiconductor material, such as Si, Ge, SiGe, SiC, InP, GaAs, and a combination thereof. Other suitable materials for carrier substrate 1036 are within the scope of the present disclosure.

Figure 12:
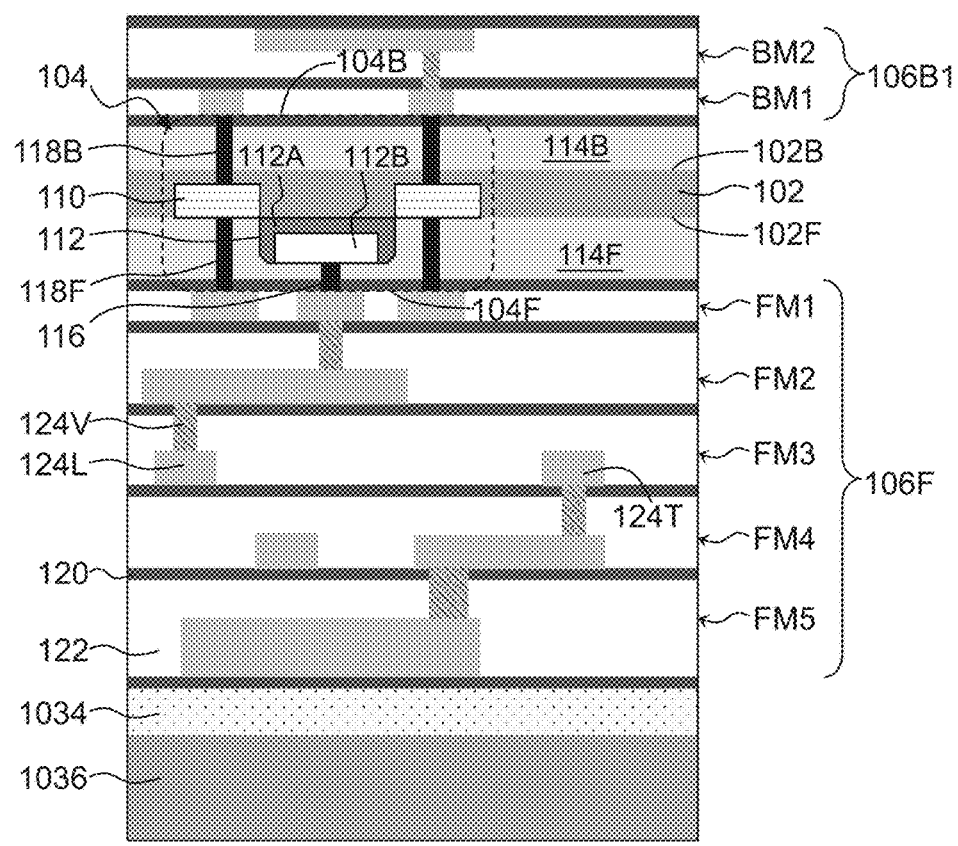

Referring to FIG. 10, in operation 1010, a first portion of a back interconnect structure is formed on a back surface of the semiconductor device. For example, as shown in FIG. 12, a first portion 106B1 of back interconnect structure 106B with metallization layers BM1-BM2 is formed on back surface 104B of semiconductor device 104. In some embodiments, instead of two metallization layers BM1-BM2, first portion 106B1 can include any number of metallization layers in which TCV 108 can be formed in subsequent processing. Thus, the number of metallization layers in first portion 106B1 can depend on the vertical dimension of TCV 108 along a Z-axis. In some embodiments, metal lines 124L and metal vias 124V of metallization layer BM2 can be formed by a single damascene process or a dual damascene process.

Prior to the formation of first portion 106B1, sequential operations of (i) flipping the structure of FIG. 11, (ii) thinning down substrate 102* to form substrate 102, as shown in FIG. 12, (iii) depositing back ILD layer 114B on back surface 102B of thinned down substrate 102, as shown in FIG. 12, and (iv) forming back S/D contact structures 118B on S/D regions 110 through back ILD layer 114 and substrate 102, as shown in FIG. 12, are performed. The thinning down process can include sequential operations of (i) performing a mechanical grinding process on back surface 102B* of substrate 102* to thin down substrate 102* to a thickness of about 20 µm to about 26 µm, (ii) performing a dry etching process on substrate 102* to further thin it down to a thickness of about 2 µm to about 5 µm, and (iii) performing a chemical mechanical polishing (CMP) process on substrate 102* to further thin it down to a thickness of about 20 nm to about 500 nm.

Figure 13:
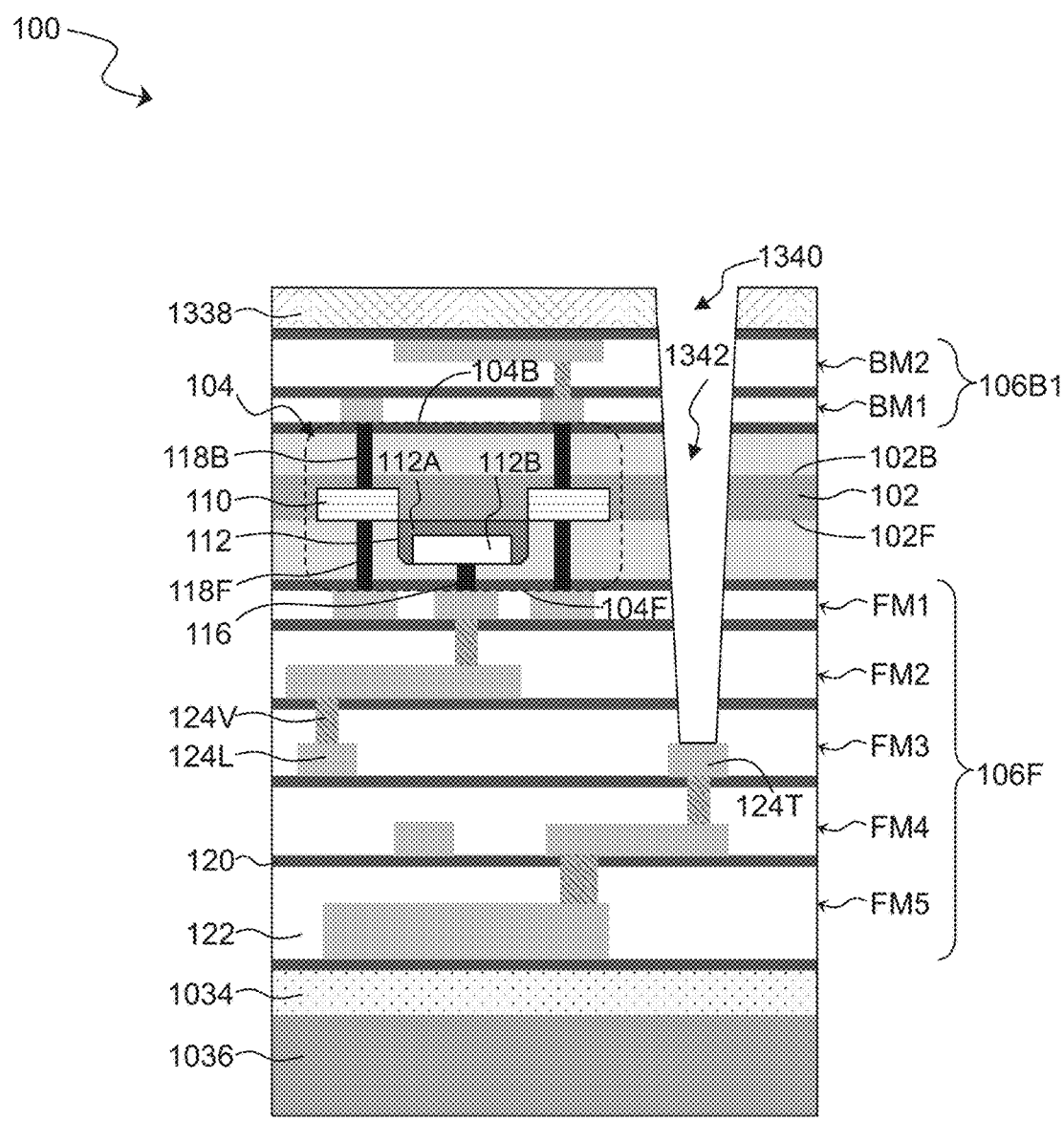
Figure 14:
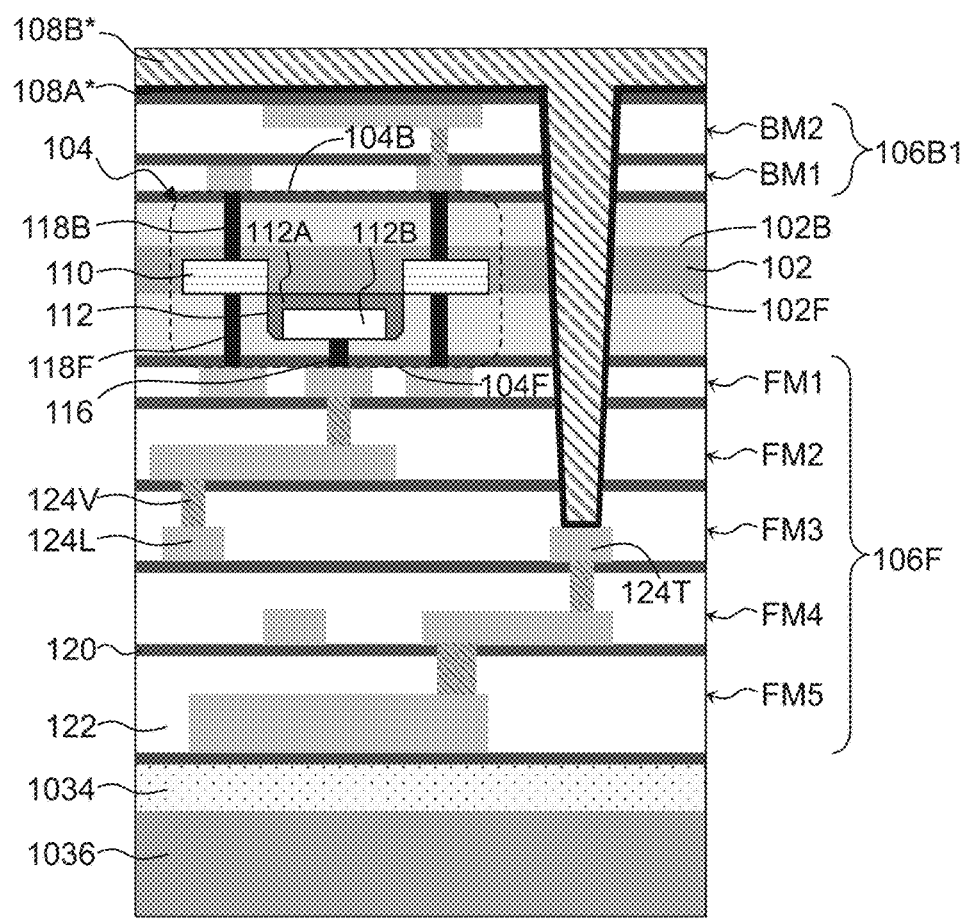
Figure 14:
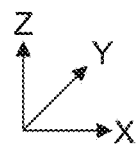
Figure 15:
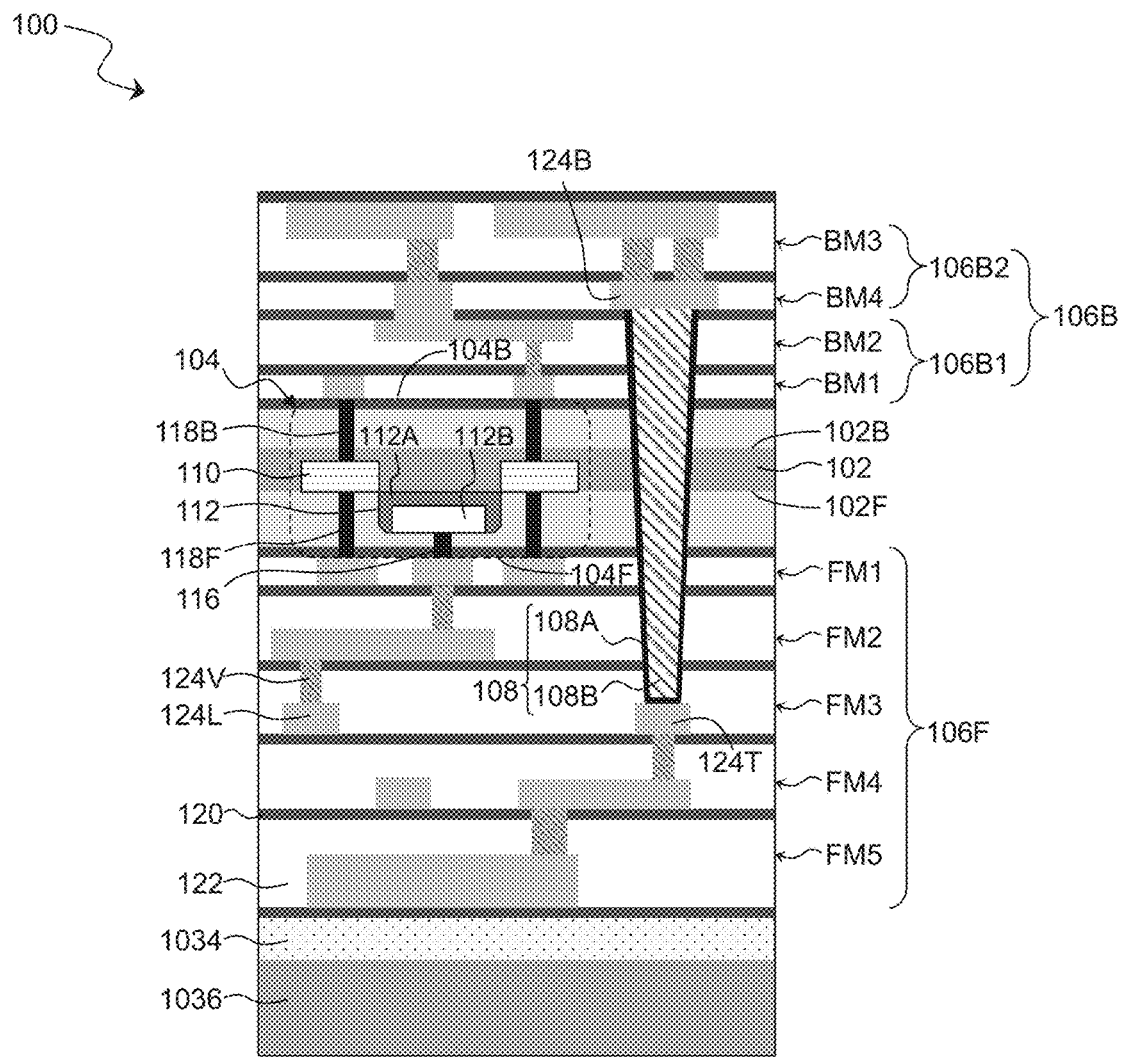

Referring to FIG. 10, in operation 1015, a TCV is formed within the front interconnect structure and the first portion of the back interconnect structure. For example, as described with reference to FIGS. 13-15, TCV 108 is formed within front interconnect structure 106F, first portion 106B1 of back interconnect structure 106B, front and back ILD layers 114F and 114B, and substrate 102. The formation of TCV 108 can include sequential operations of (i) forming a patterned masking layer 1338 (e.g., a photoresist layer) with an opening 1340 on the structure of FIG. 12, as shown in FIG. 13, (ii) forming a TCV opening 1342 through opening 1340 on metal line 124T, as shown in FIG. 13, (iii) depositing a liner material 108A* on the structure of FIG. 13 after removing patterned masking layer 1338, as shown in FIG. 14, (iv) depositing a conductive plug material 108B* on liner material 108A*, as shown in FIG. 14, and (v) performing a chemical mechanical polish (CMP) process on the structure of FIG. 14 to form TCV 108, as shown in FIG. 15.

The formation of TCV opening 1342 can include etching ESLs 120 and IMD layers 122 of metallization layers BM1-BM2, ILD layers 114F-114B, substrate 102, and ESLs 120 and IMD layers 122 of metallization layers FM1-FM3 through opening 1340 of patterned masking layer 1338. Metal line 124T can act as an etch stop layer to control the etching depth of TCV opening 1342. In some embodiments, the etching of ESLs 120, IMD layers 122, and ILD layers 114F-114B through opening 1340 can include a dry etching process using carbon fluoride gas ($C_xF_y$), carbon hydrofluoride gas ($C_xH_yF_z$), and/or carbon oxide ($CO_x$) gas at a power ranging from about 500 watts to about 5000 watts. In some embodiments, the etching of substrate 102 through opening 1340 can include a dry etching process using sulfur hexafluoride ($SF_6$) gas, chlorine gas, hydrogen bromide (HBr) gas, hydrogen chloride (HCl) gas, and/or hydrogen iodide (HI) gas at a power ranging from about 500 watts to about 5000 watts.

Liner material 108A* can be deposited using atomic layer deposition (ALD) process or a chemical vapor deposition (CVD) process. Conductive plug material 108B* can be deposited using a CVD process, an ALD process, or a physical vapor deposition (PVD) process. In some embodiments, liner material 108A* can include a conductive material, such as Ta, Ti, Co, W, Ru, alloys of Ta, Ti, Co, W, Ru, and combinations thereof. In some embodiments, conductive plug material 108B* can include a conductive material, such as Cu, W, Ti, Ta, Al, Co, Ru, alloys of Cu, W, Ti, Ta, Al, Co, Ru, and combinations thereof.

Referring to FIG. 10, in operation 1020, a second portion of the back interconnect structure is formed on the TCV and the first portion of the back interconnect structure. For example, as shown in FIG. 15, a second portion 106B2 of back interconnect structure 106B with metallization layers BM3-BM4 is formed on TCV 108 and first portion 106B1. In some embodiments, instead of two metallization layers BM3-BM4, second portion 106B2 can include any number of metallization layers. In some embodiments, metal lines 124L and metal vias 124V of metallization layer BM3 can be formed by a single damascene process or a dual damascene process. In some embodiments, bonding layer 1034 and carrier substrate 1036 can be removed after operation 1020.

Figure 16:
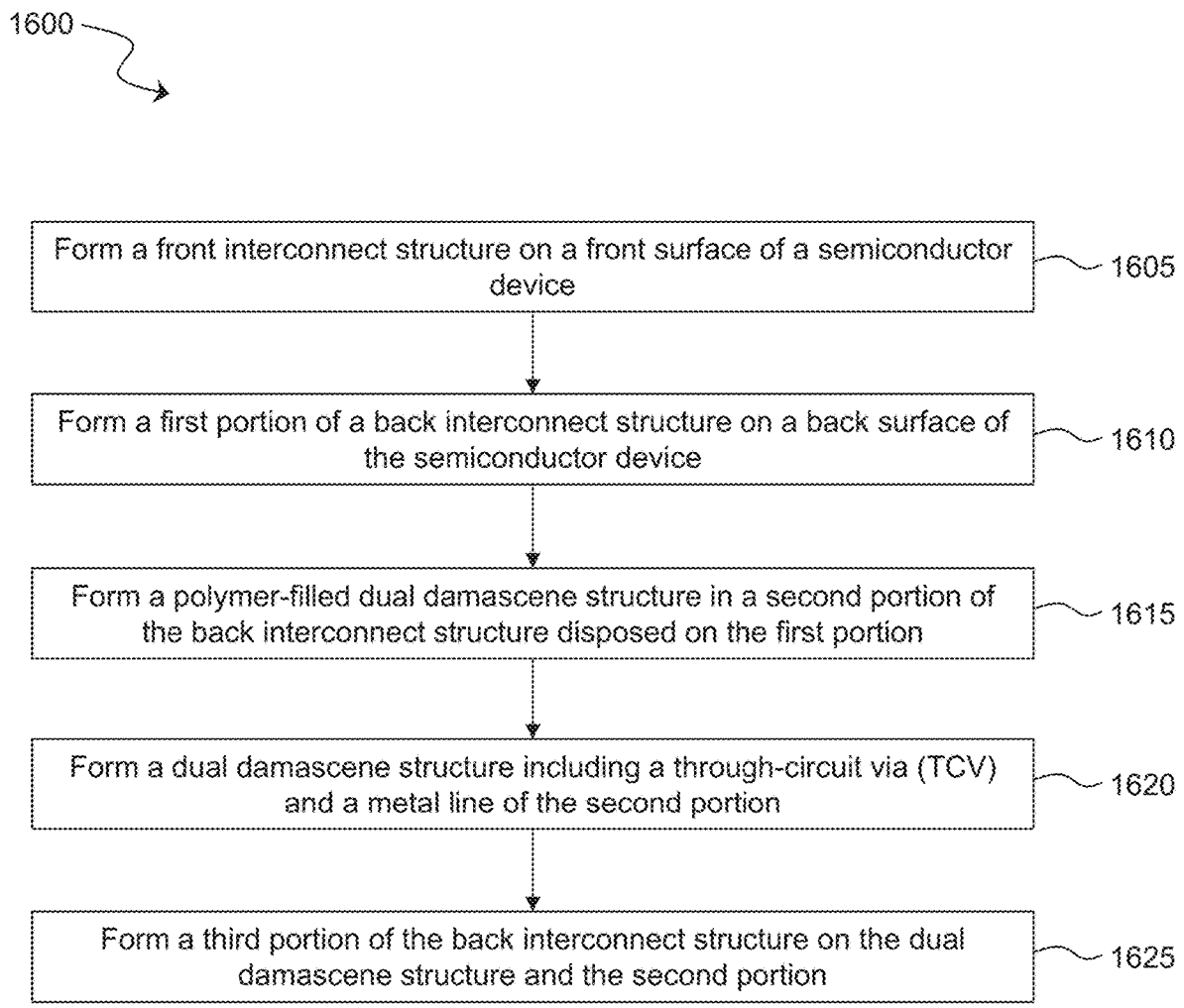
FIG. 16 is a flow diagram of a method for fabricating an IC with a TCV, in accordance with some embodiments.

FIG. 16 is a flow diagram of an example method 1600 for fabricating IC 200, according to some embodiments. For illustrative purposes, the operations illustrated in FIG. 16 will be described with reference to the example fabrication process for fabricating IC 200 as illustrated in FIGS. 17-26. FIGS. 17-26 are cross-sectional views of IC 200 at various stages of fabrication, according to some embodiments. Operations can be performed in a different order or not performed depending on specific applications. It should be noted that method 1600 may not produce a complete IC 200. Accordingly, it is understood that additional processes can be provided before, during, and after method 1600, and that some other processes may only be briefly described herein. Elements in FIGS. 17-26 with the same annotations as elements in FIGS. 1-9 and 11-15 are described above.

Referring to FIG. 16, operations 1605 and 1610 are similar to operations 1005 and 1010, respectively, of FIG. 10. Structure similar to FIG. 12 is formed after operation 1610.

Figure 17:
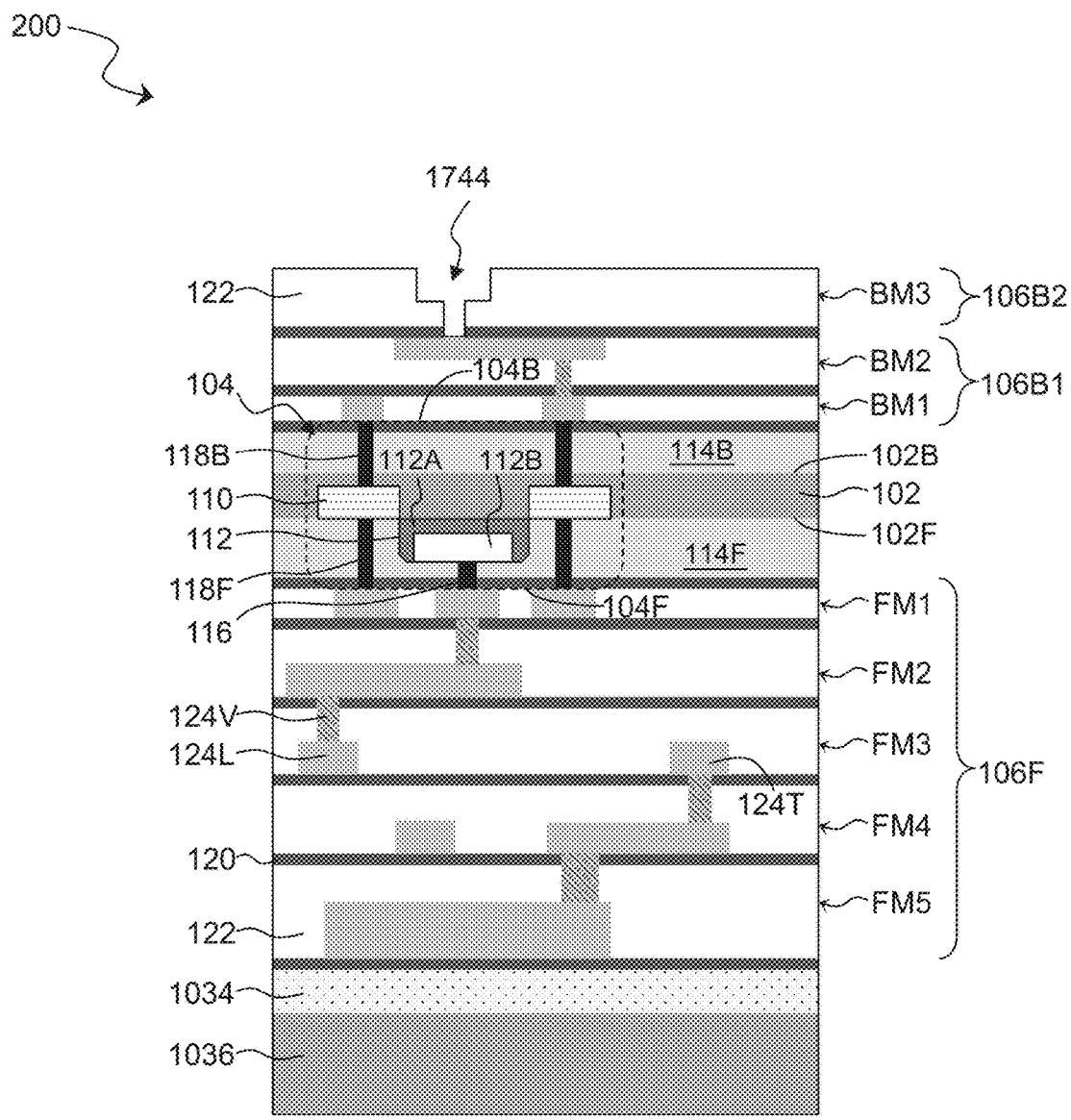
FIGS. 17-26 illustrate cross-sectional views of an IC with a TCV at various stages of its fabrication process, in accordance with some embodiments.
Figure 18:
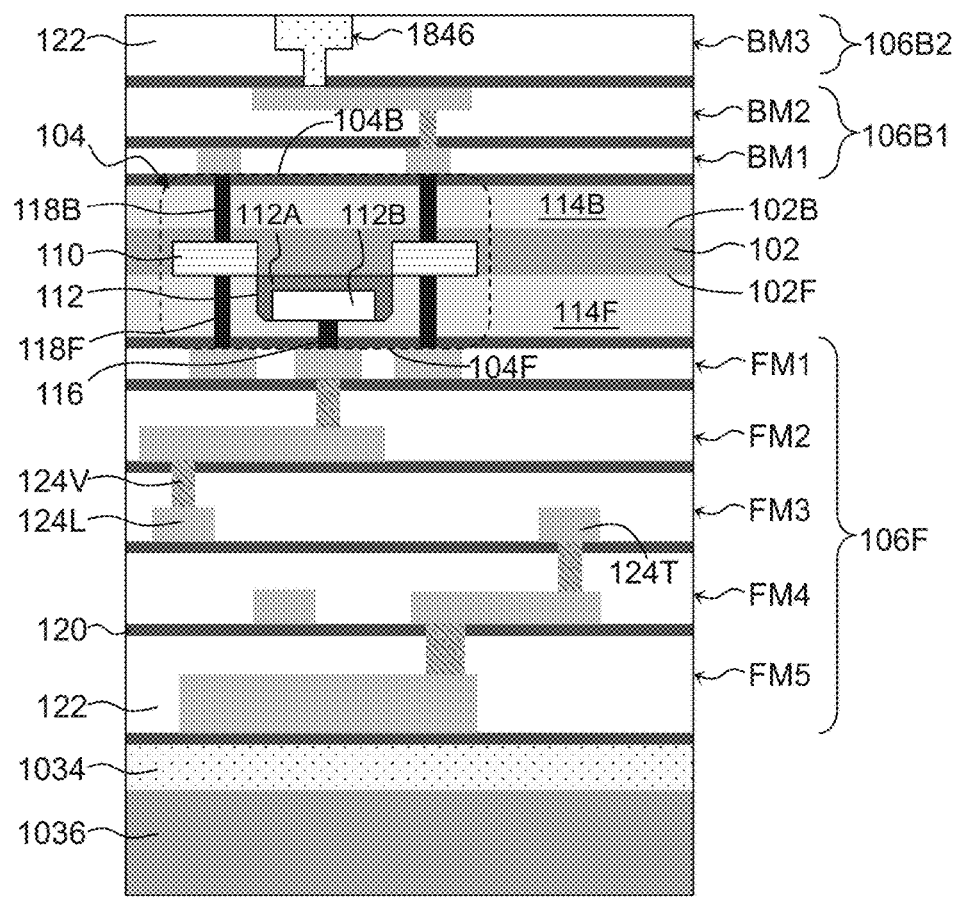

Referring to FIG. 16, in operation 1615, a polymer-filled DD structure is formed in a second portion of the back interconnect structure disposed on the first portion of the back interconnect structure. For example, as described with reference to FIGS. 17-18, a polymer-filled DD structure 1846 is formed in a second portion 106B2, which includes metallization layer BM3 of back interconnect structure 106B. The formation of polymer-filled DD structure 1846 can include sequential operations of (i) depositing IMD layer 122 on the structure of FIG. 12, as shown in FIG. 17, (ii) forming an opening 1744 (also referred to as "DD opening 1744") in a dual damascene process, as shown in FIG. 17, (iii) depositing a polymer layer (not shown) on the structure of FIG. 17 by a spin-coating process to fill opening 1744, (iv) curing (also referred to as "hardening") the polymer layer by a thermal process, and (v) performing a CMP process on the cured polymer layer to form polymer-filled DD structure 1846, as shown in FIG. 18. The polymer layer can include an organic material that is different from a photoresist material. In some embodiments, the polymer layer can include methacrylic acid, ethyl methacrylate, tert-butyl methacrylate, isobornyl methacrylate, or other suitable organic material. In subsequent processing, polymer-filled DD structure 1846 can be replaced with a metal-filled DD structure 2564 (shown in FIG. 25) including metal line 124L and metal via 124V of metallization layer BM3, which is described in detail below. In some embodiments, metal line 124 and metal via 124 may be absent from metallization layer BM3, and as a result, operations (ii)-(v) may not be performed in operation 1615.

Figure 19:
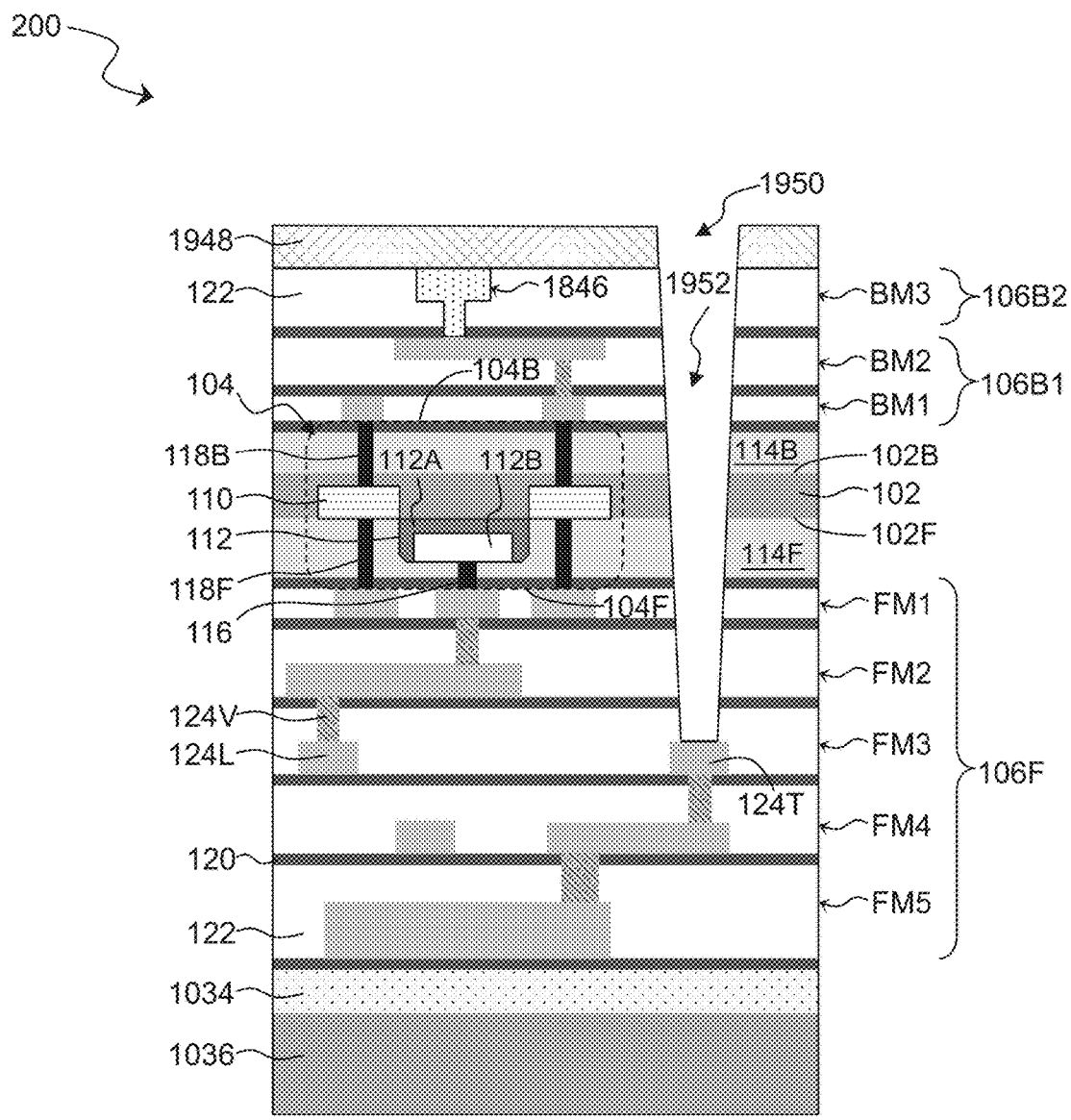
Figure 20:
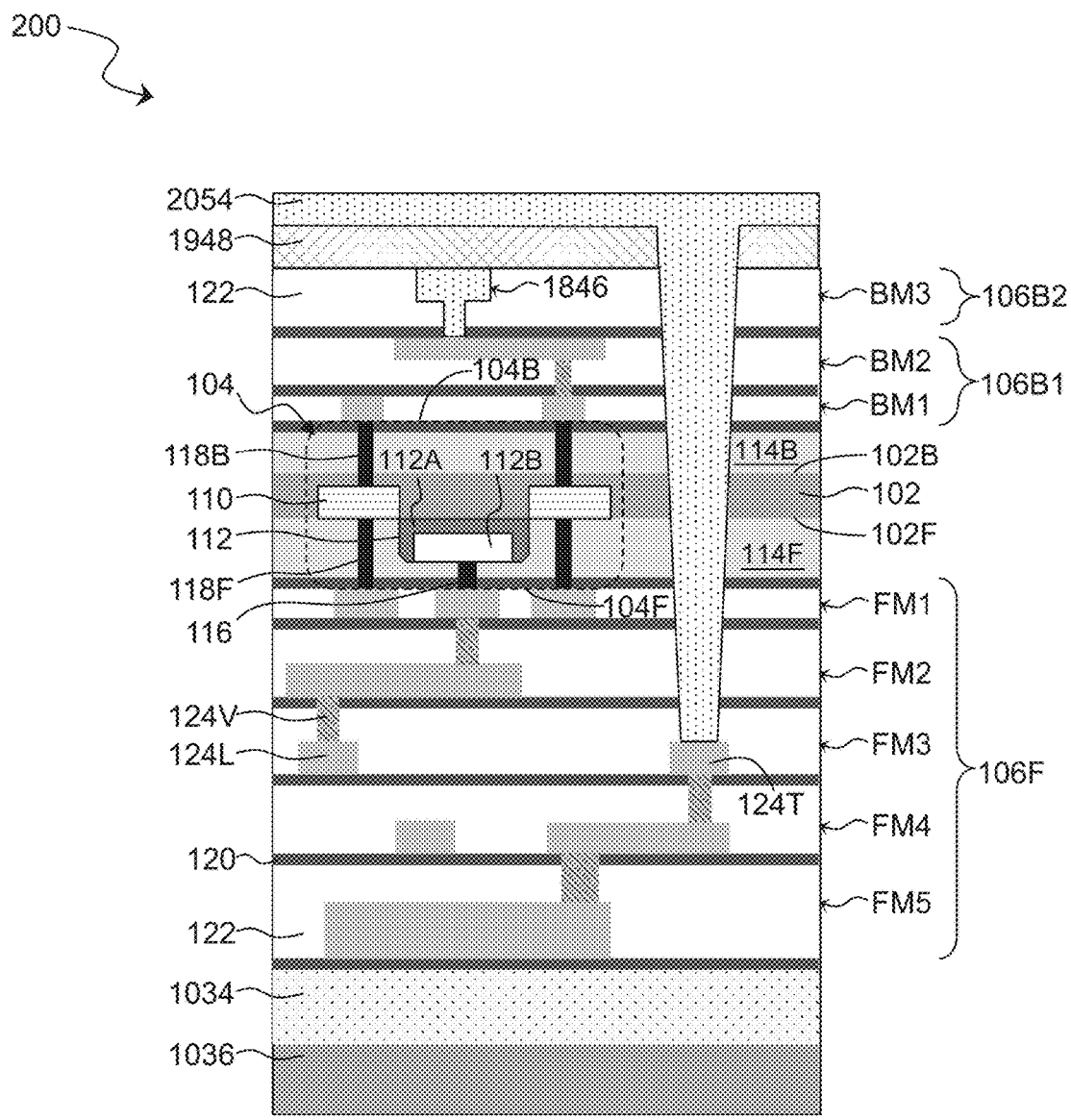
Figure 21:
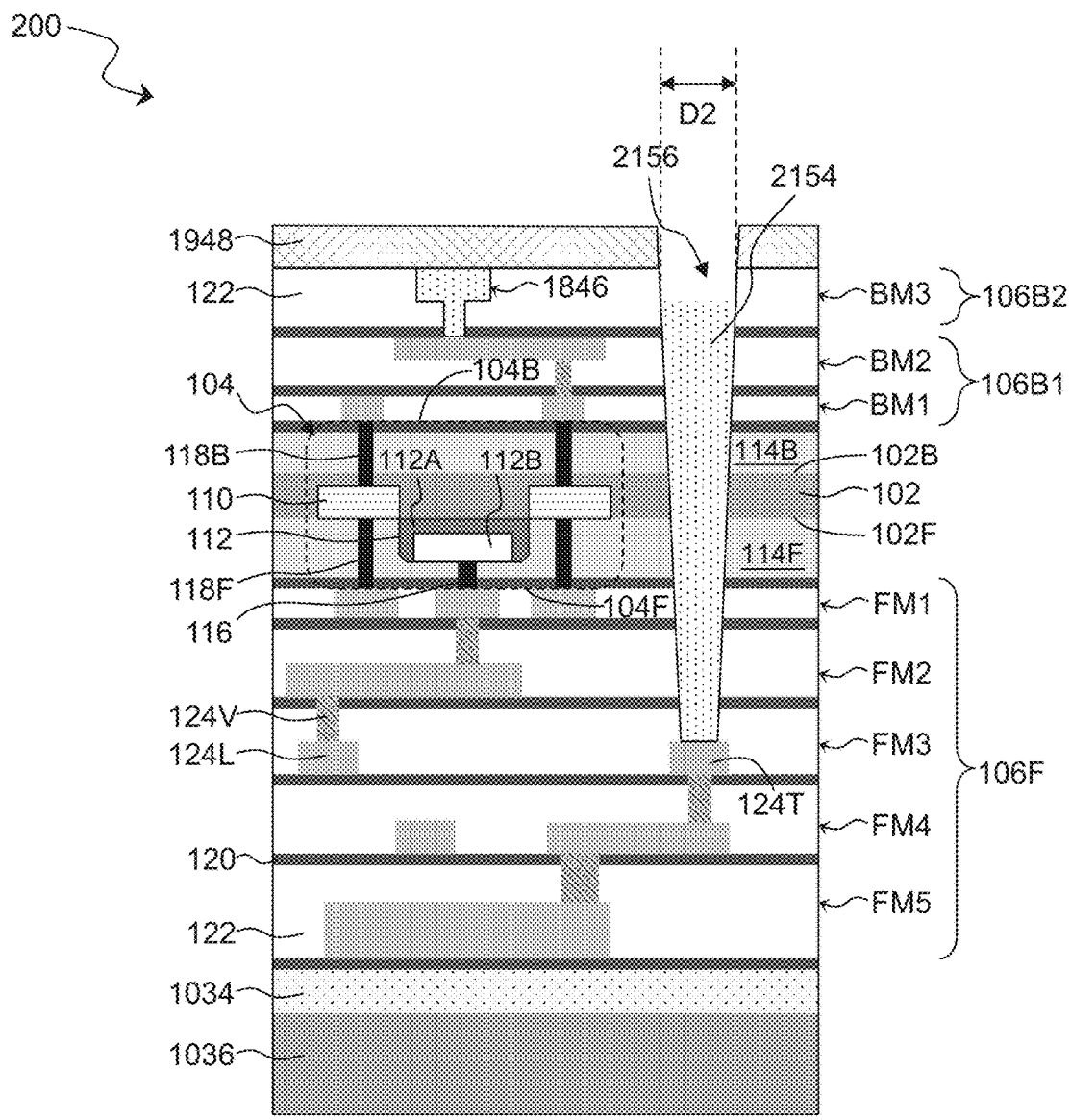
Figure 22:
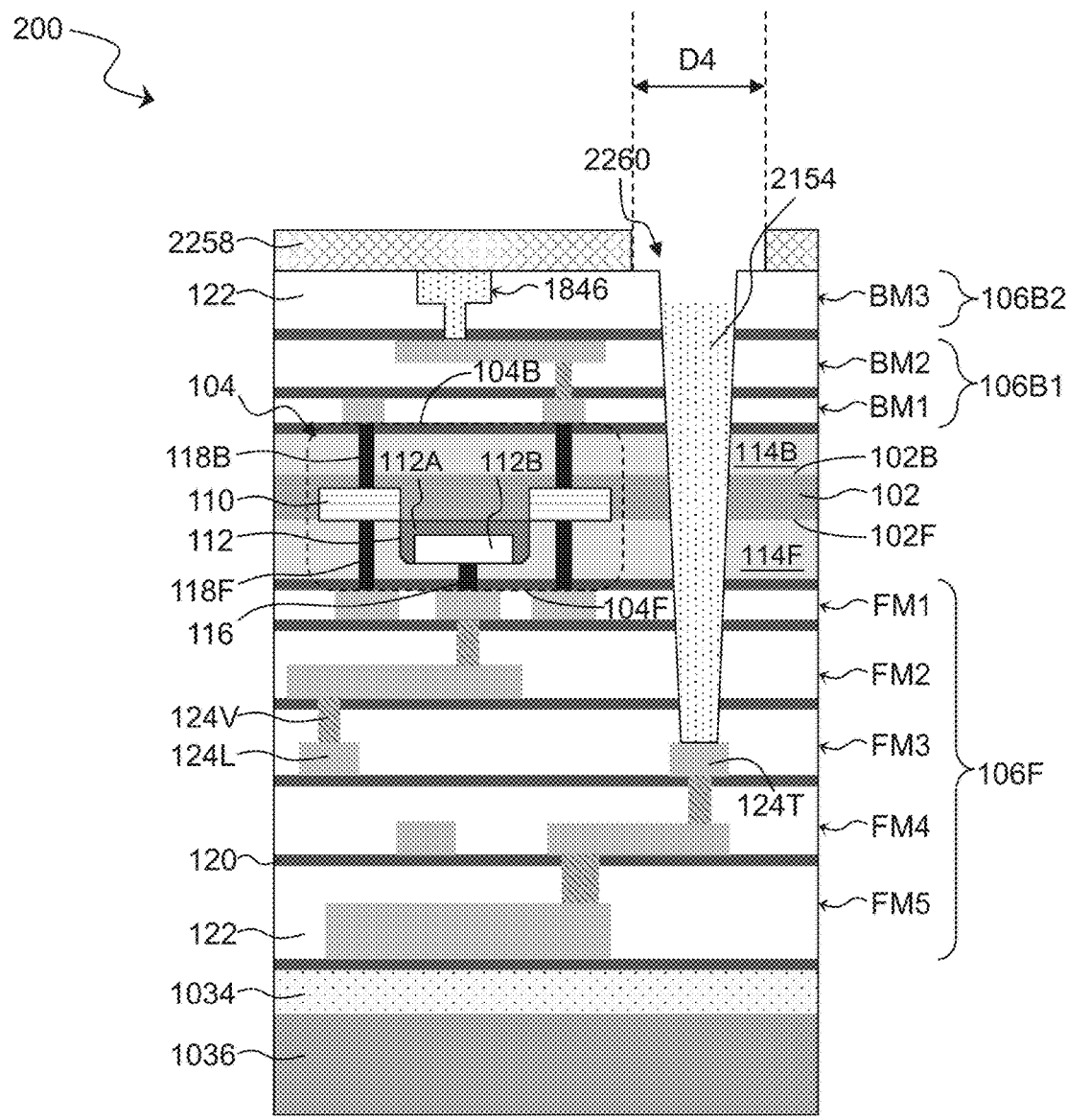
Figure 23:
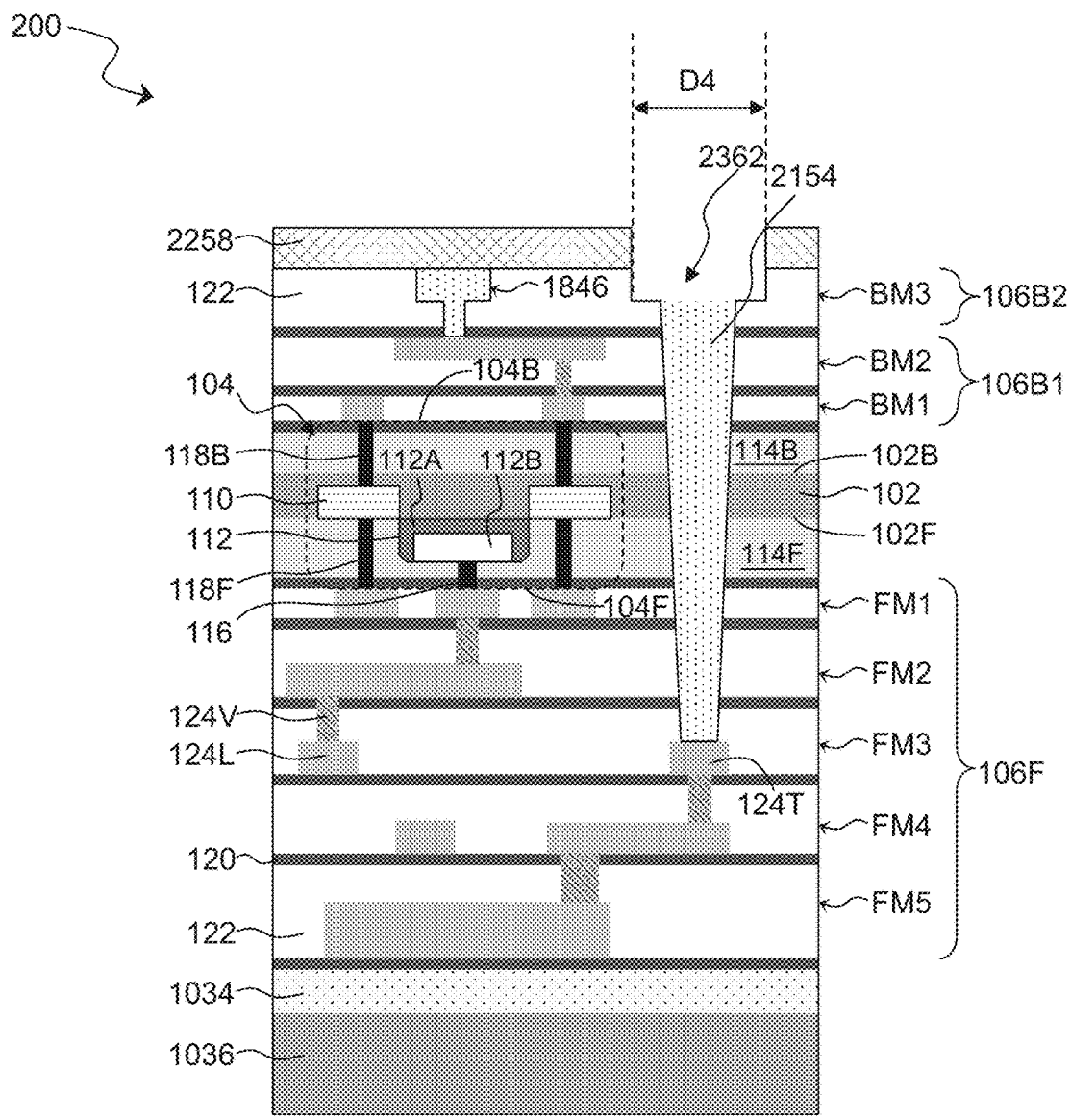
Figure 24:
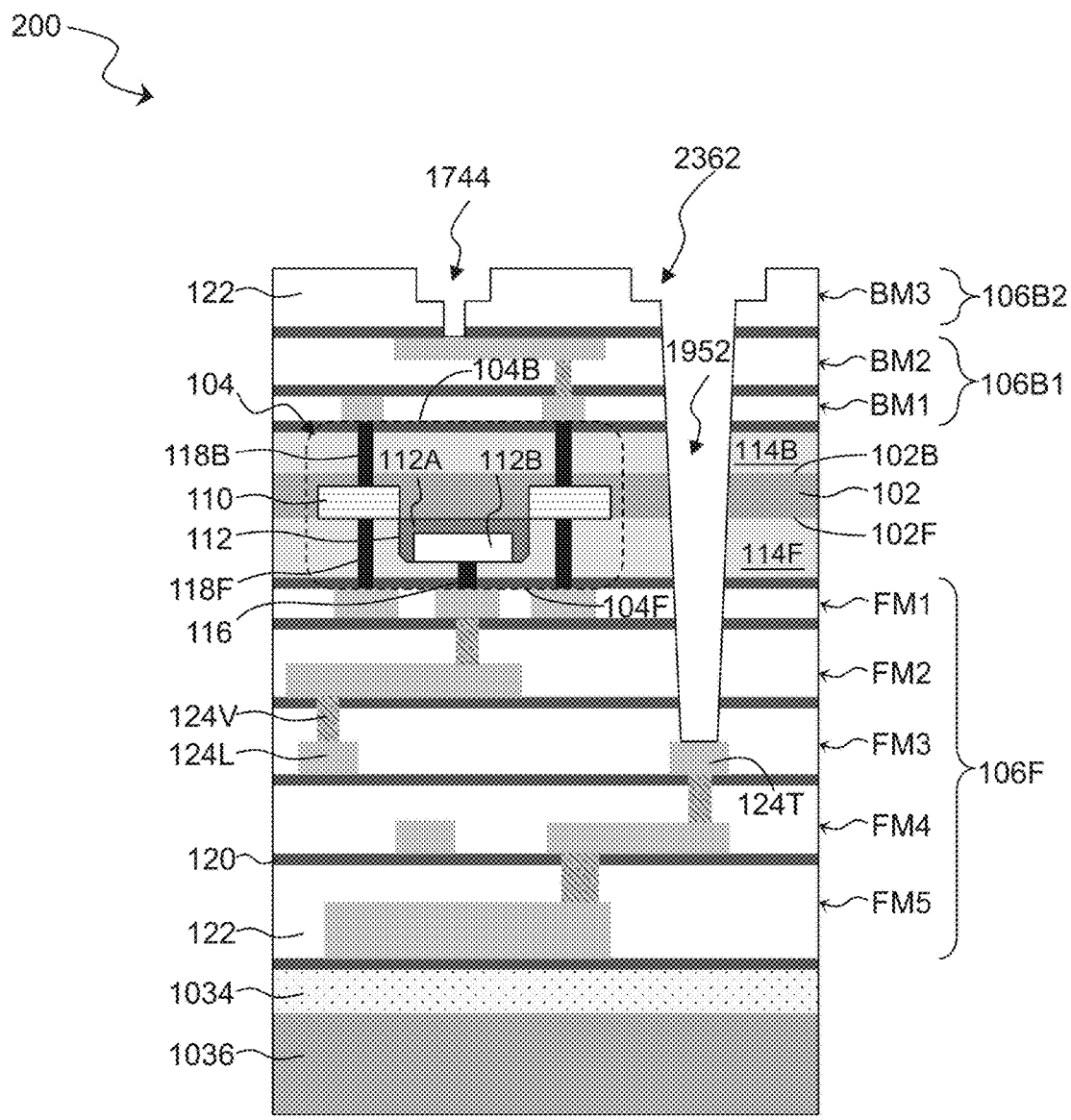
Figure 25:
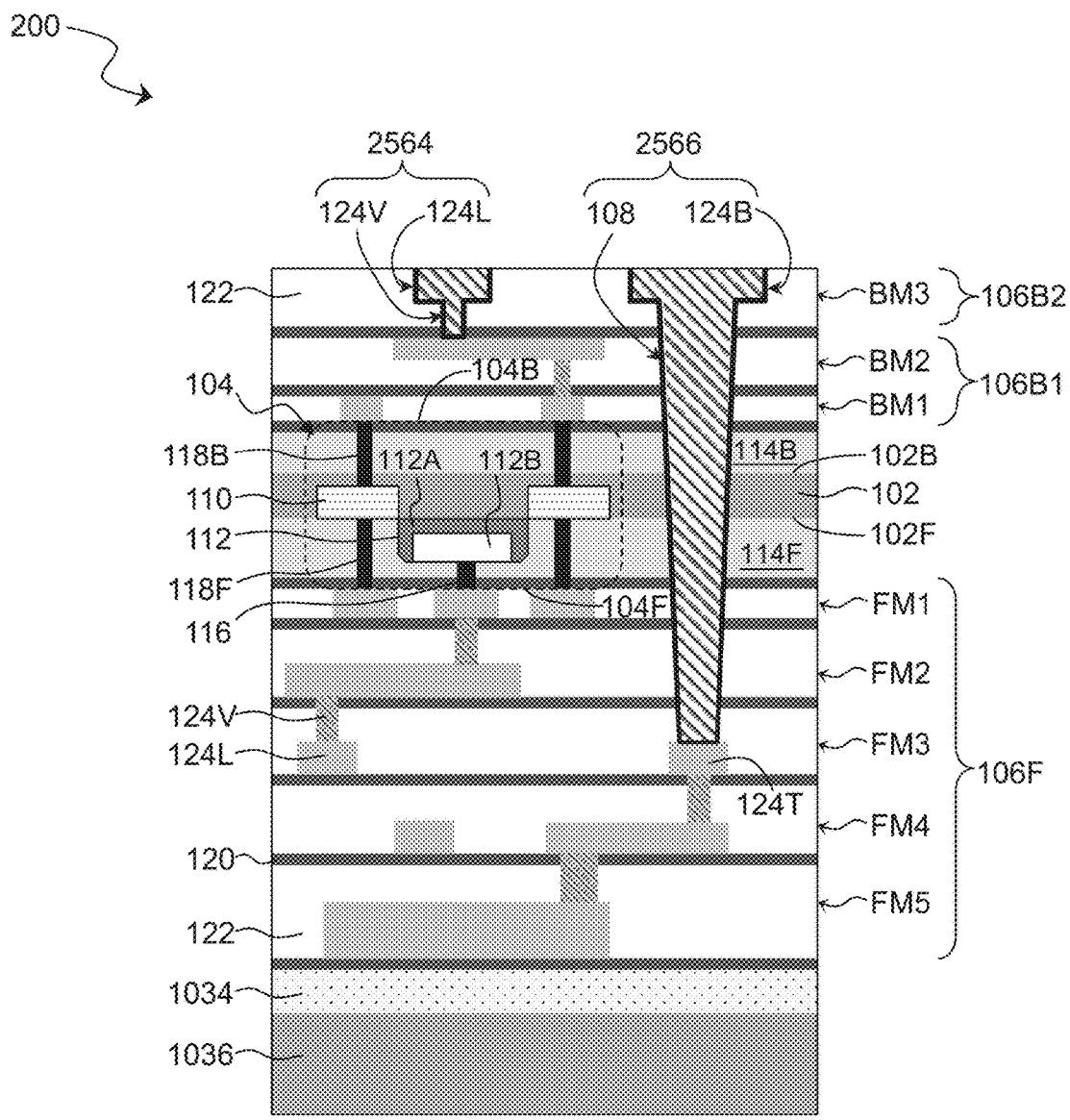

Referring to FIG. 16, in operation 1620, a DD structure including a TCV and a metal line of the second portion is formed. For example, as described with reference to FIGS. 19-25, a DD structure 2566 including metal line 124B and TCV 108 is formed in a dual damascene process. The formation of DD structure 2566 can include sequential operations of (i) forming a patterned masking layer 1948 (e.g., a photoresist layer) with an opening 1950 on the structure of FIG. 18, as shown in FIG. 19, (ii) forming a TCV opening 1952 through opening 1950 on metal line 124T, as shown in FIG. 19, (iii) depositing a polymer layer 2054 on the structure of FIG. 19 by a spin-coating process to fill openings 1950-1952, as shown in FIG. 20, (iv) curing (also referred to as "hardening") polymer layer 2054 by a thermal process, (v) etching cured polymer layer 2054 to form a polymer plug 2154 within opening 1952, as shown in FIG. 21, (vi) replacing patterned masking layer 1948 with a patterned masking layer 2258 (e.g., a photoresist layer) with an opening 2260, as shown in FIG. 22, (vii) forming a metal line opening 2362 by etching a portion of IMD layer 122 of metallization layer BM3 through opening 2260, as shown in FIG. 23, (viii) removing patterned masking layer 2258 by a plasma ashing process, (ix) removing polymer plug 2154 from opening 1952 by a wet etch process, as shown in FIG. 24, (x) depositing a liner material, similar to liner material 108A*, on the structure of FIG. 24 to line the sidewalls of openings 1952 and 2362, (xi) depositing a conductive plug material, similar to conductive plug material 108B*, on the liner material to fill openings 1952 and 2362, and (xii) performing a CMP process on the liner material and the conductive plug material, similar to operation 1015, to form DD structure 2566 including TCV 108 and metal line 124B, as shown in FIG. 25.

The formation of TCV opening 1952 can include etching ESLs 120 and IMD layers 122 of metallization layers BM1-BM3, ILD layers 114F-114B, substrate 102, and ESLs 120 and IMD layers 122 of metallization layers FM1-FM3 through opening 1950 of patterned masking layer 1948. Metal line 124T can act as an etch stop layer to control the etching depth of TCV opening 1952. Polymer plug 2154 can include an organic material similar to the polymer layer of polymer-filled DD structure 1846. The dimensions of polymer plug 2154 can define the dimensions of subsequently-formed TCV 108 and can act as an etch stop layer to control the etching depth of metal line opening 2362 and maintain the dimensions for subsequently-formed TCV 108.

In some embodiments, polymer-filled DD structure 1846 can be replaced with metal-filled DD structure 2564 (shown in FIG. 25) during the formation of DD structure 2566. The replacement of polymer-filled DD structure 1846 with metal-filled DD structure 2564 can include sequential operations of (i) removing the polymer layer from opening 1744 at the same time as removing polymer plug 2154 with the wet etch process, as shown in FIG. 24, (ii) depositing the liner material along the sidewalls of opening 1744 at the same time as depositing the liner material along the sidewalls of openings 1952 and 2362, (iii) depositing the conductive plug material on the liner material to fill opening 1744 at the same time as depositing the conductive plug material to fill openings 1952 and 2362, and (iv) performing the CMP process on the liner material and the conductive plug material to form metal-filled DD structure 2564 at the same time as performing the CMP process to form DD structure 2566, as shown in FIG. 25. In some embodiments, metal line 124 and metal via 124 may be absent from metallization layer BM3, and as a result, the operations of forming DD structure 2564 may not be performed in operation 1620.

Figure 26:
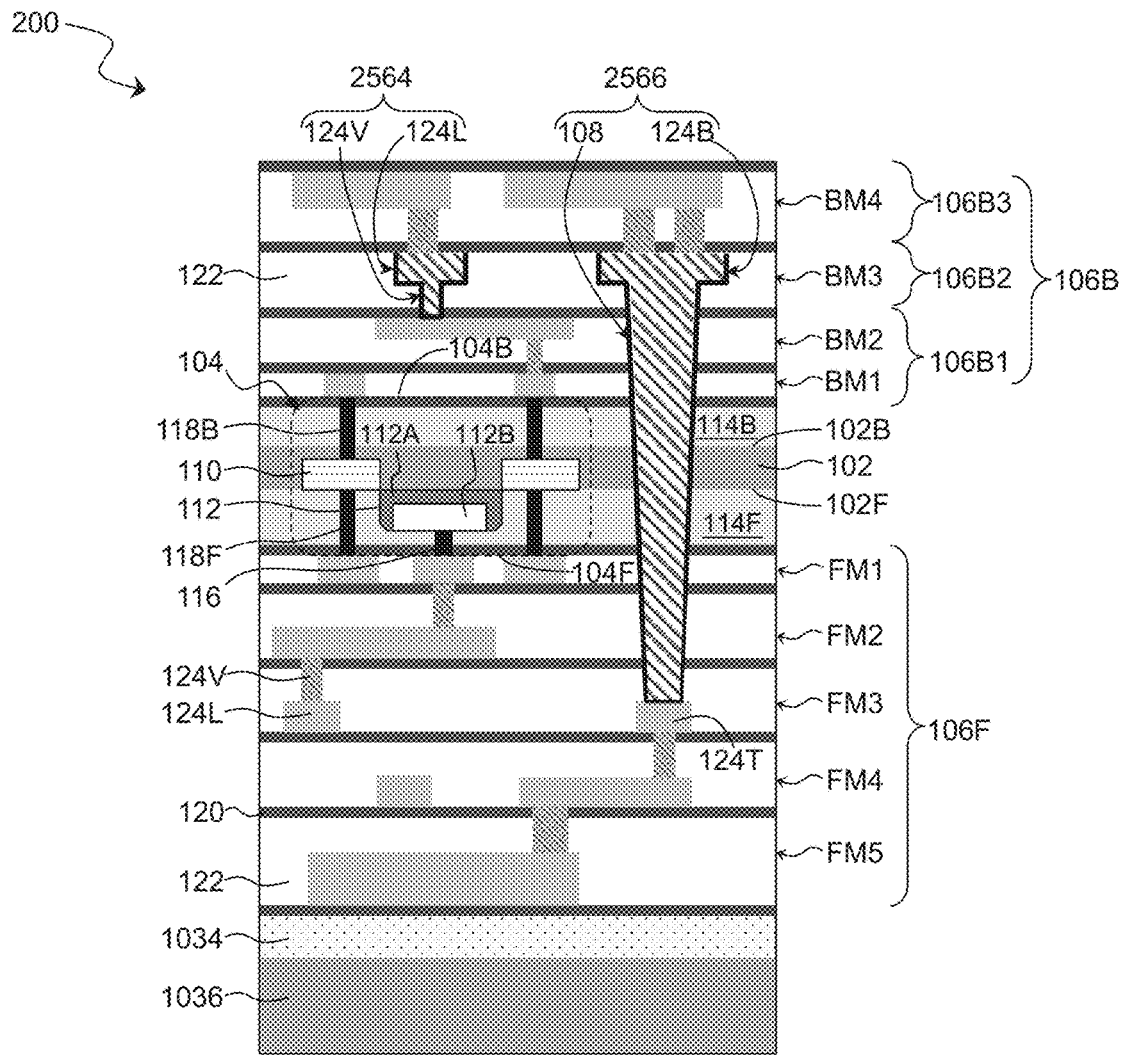

Referring to FIG. 16, in operation 1625, a third portion of the back interconnect structure is formed on the DD structure and the second portion of the back interconnect structure. For example, as shown in FIG. 26, a third portion 106B3 of back interconnect structure 106B with metallization layer BM4 is formed on DD structures 2564-2566 and second portion 106B2. In some embodiments, instead of one metallization layer BM4, third portion 106B3 can include any number of metallization layers. In some embodiments, metal lines 124L and metal vias 124V of metallization layer BM4 can be formed by a single damascene process or a dual damascene process. In some embodiments, bonding layer 1034 and carrier substrate 1036 can be removed after operation 1625.

Figure 27:
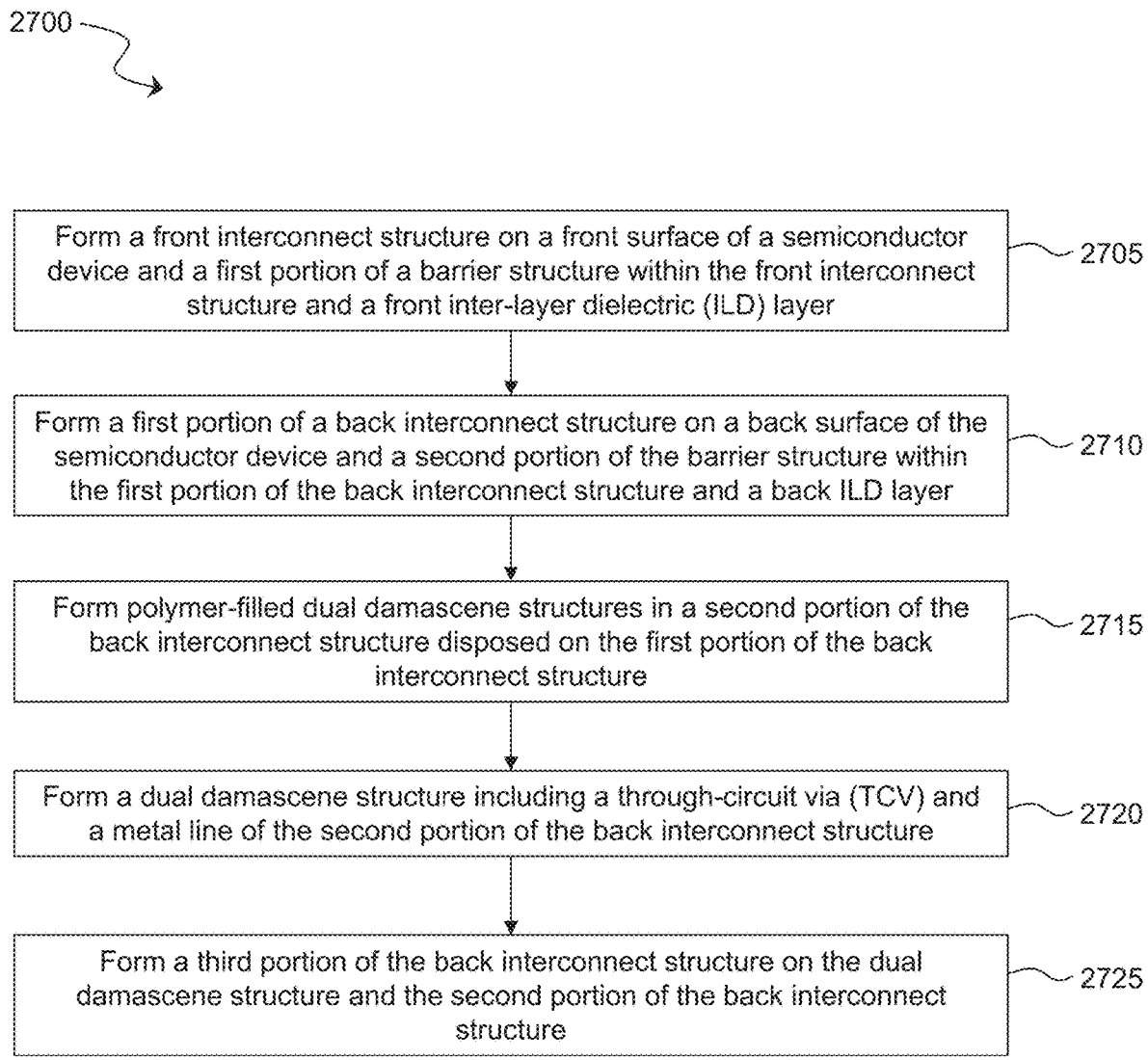
FIG. 27 is a flow diagram of a method for fabricating an IC with a TCV, in accordance with some embodiments.

FIG. 27 is a flow diagram of an example method 2700 for fabricating IC 300, according to some embodiments. For illustrative purposes, the operations illustrated in FIG. 27 will be described with reference to the example fabrication process for fabricating IC 300 as illustrated in FIGS. 28-33. FIGS. 28-33 are cross-sectional views of IC 300 at various stages of fabrication, according to some embodiments. Operations can be performed in a different order or not performed depending on specific applications. It should be noted that method 2700 may not produce a complete IC 300. Accordingly, it is understood that additional processes can be provided before, during, and after method 2700, and that some other processes may only be briefly described herein. Elements in FIGS. 28-33 with the same annotations as elements in FIGS. 1-9, 11-15, and 17-26 are described above.

Figure 28:
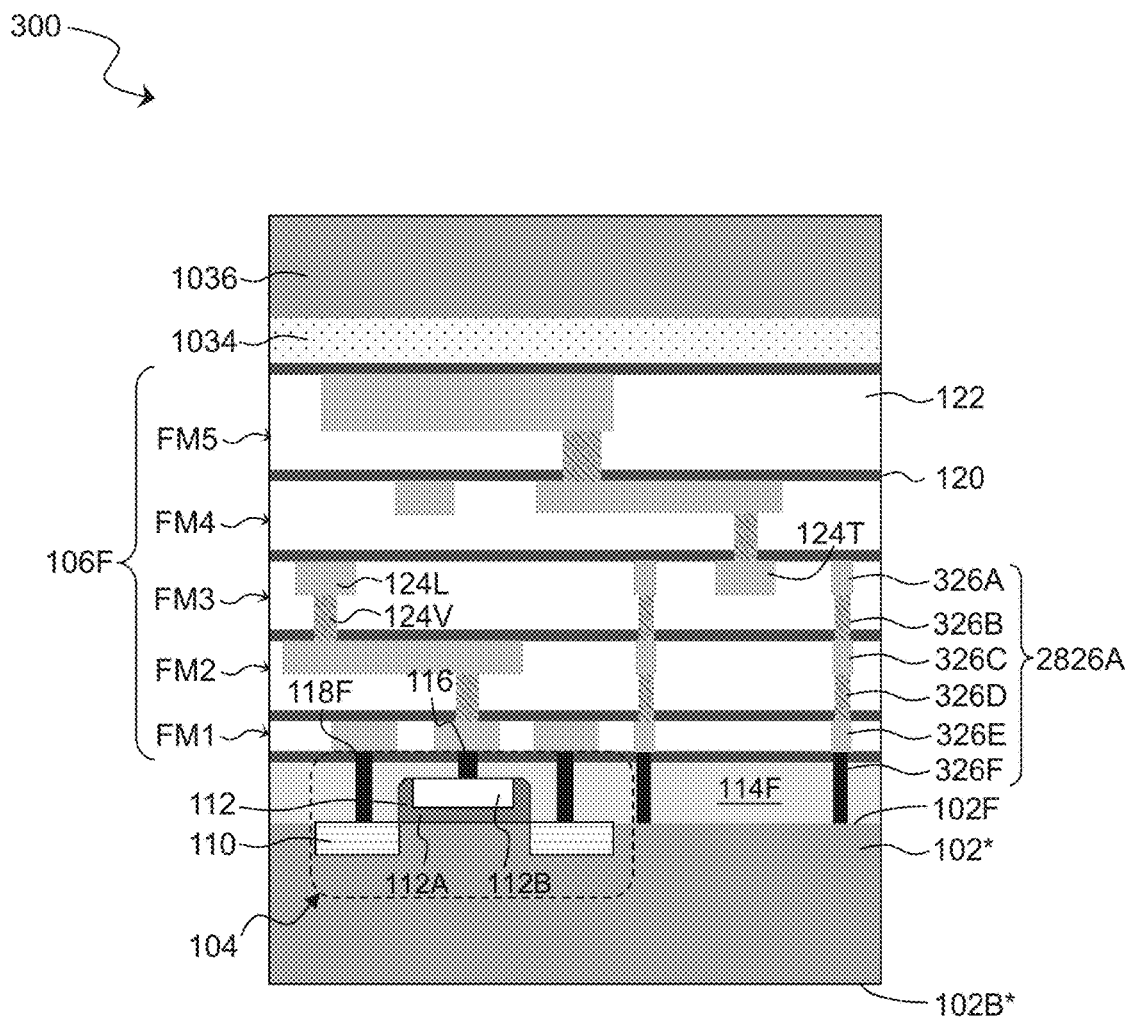
FIGS. 28-33 illustrate cross-sectional views of an IC with a TCV at various stages of its fabrication process, in accordance with some embodiments.

In operation 2705, a front interconnect structure is formed on a front surface of a semiconductor device and a first portion of a barrier structure is formed within the front interconnect structure and a front ILD layer. For example, as shown in FIG. 28, front interconnect structure 106F is formed on front surface 104F of semiconductor structure 104, which is formed on front surface 102F of substrate 102\* and a first portion 2826A with barrier layers 326A-326F of barrier structure 326 (as shown in FIGS. 3-4) is formed within front interconnect structure 106F and front ILD layer 114F.

In some embodiments, the formation of first portion 2826A can include sequential operations of (i) forming barrier layer 326F within front ILD layer 114F at the same time and with similar material as front S/D contact structures 118F, (ii) forming barrier layer 326E on barrier layer 326F at the same time and with similar material as metal lines 124L of metallization layer FM1, (iii) forming barrier layer 326D on barrier layer 326E at the same time and with similar material as metal via 124V of metallization layer FM2, (iv) forming barrier layer 326C on barrier layer 326D at the same time and with similar material as metal line 124L of metallization layer FM2, (v) forming barrier layer 326B on barrier layer 326C at the same time and with similar material as metal via 124V of metallization layer FM3, and (vi) forming barrier layer 326A on barrier layer 326B at the same time and with similar material as metal line 124L of metallization layer FM3. Similar to operation 1005, bonding layer 1034 and carrier substrate 1036 can be formed on metallization layer FM5, as shown in FIG. 28.

Figure 29:
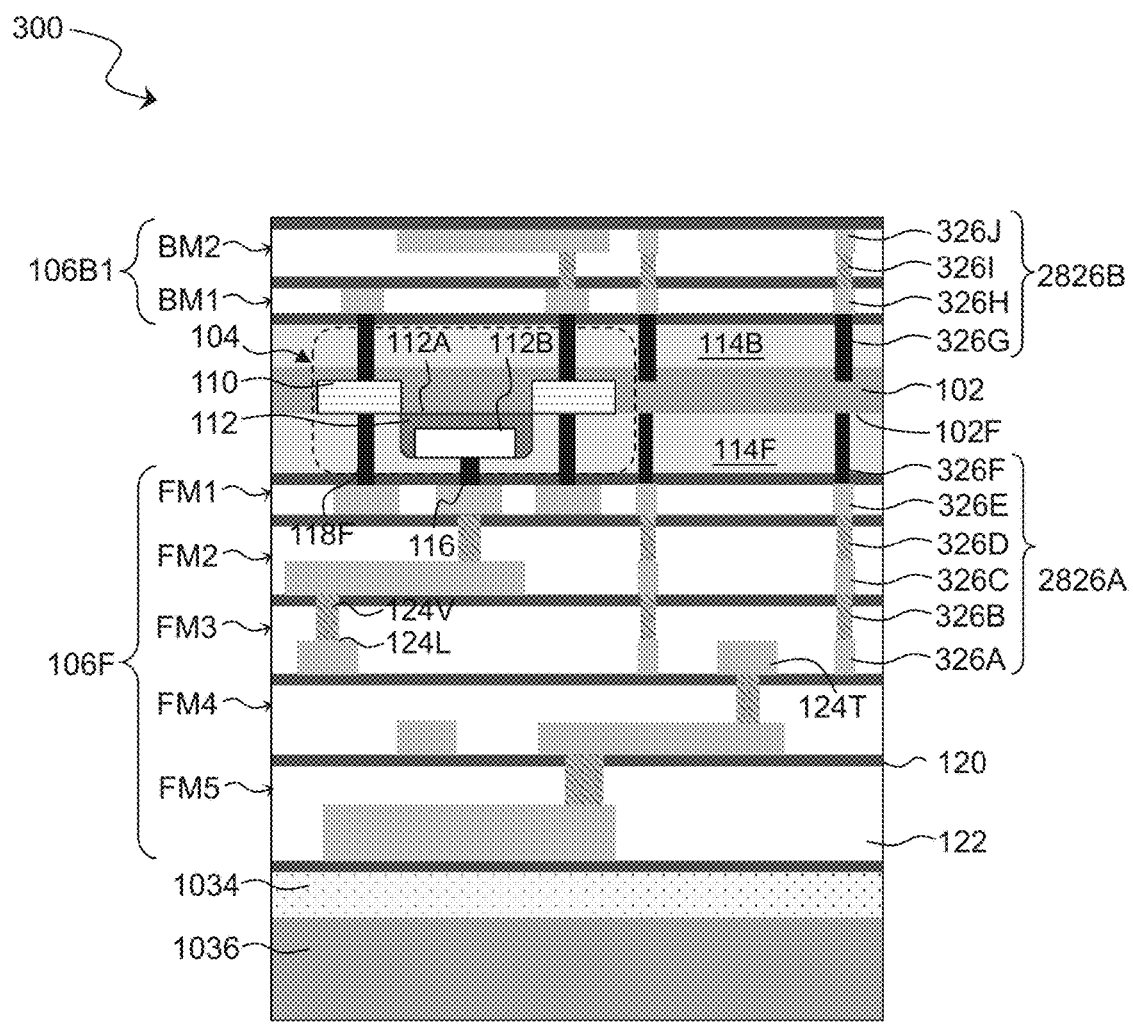

Referring to FIG. 27, in operation 2710, a first portion of a back interconnect structure is formed on a back surface of the semiconductor device and a second portion of the barrier structure is formed within the first portion of the back interconnect structure and a back ILD layer. For example, as shown in FIG. 29, first portion 106B1 of back interconnect structure 106B with metallization layers BM1-BM2 is formed on back surface 104B of semiconductor device 104 and a second portion 2826B with barrier layers 326G-326J of barrier structure 326 is formed within the first portion 106B1 and back ILD layer 114B. The discussion of operation 1010 with reference to FIG. 12 applies to operation 2710 and the structure of FIG. 29, unless mentioned otherwise.

In some embodiments, the formation of second portion 2826B can include sequential operations of (i) forming barrier layer 326G within back ILD layer 114B at the same time and with similar material as back S/D contact structures 118B, (ii) forming barrier layer 326H on barrier layer 326G at the same time and with similar material as metal lines 124L of metallization layer BM1, (iii) forming barrier layer 326I on barrier layer 326H at the same time and with similar material as metal via 124V of metallization layer BM2, and (iv) forming barrier layer 326J on barrier layer 326I at the same time and with similar material as metal line 124L of metallization layer BM2.

Referring to FIG. 27, in operation 2715, polymer-filled DD structures are formed in a second portion of the back interconnect structure disposed on the first portion of the back interconnect structure. For example, as described with reference to FIGS. 30-31, polymer-filled DD structures 1846 and 3146 are formed in second portion 106B2, which includes metallization layer BM3 of back interconnect structure 106B. In subsequent processing, polymer-filled DD structures 1846 and 3146 can be replaced with metal-filled DD structures 2564 and 2826C (shown in FIG. 33), respectively, which is described in detail below.

Figure 30:
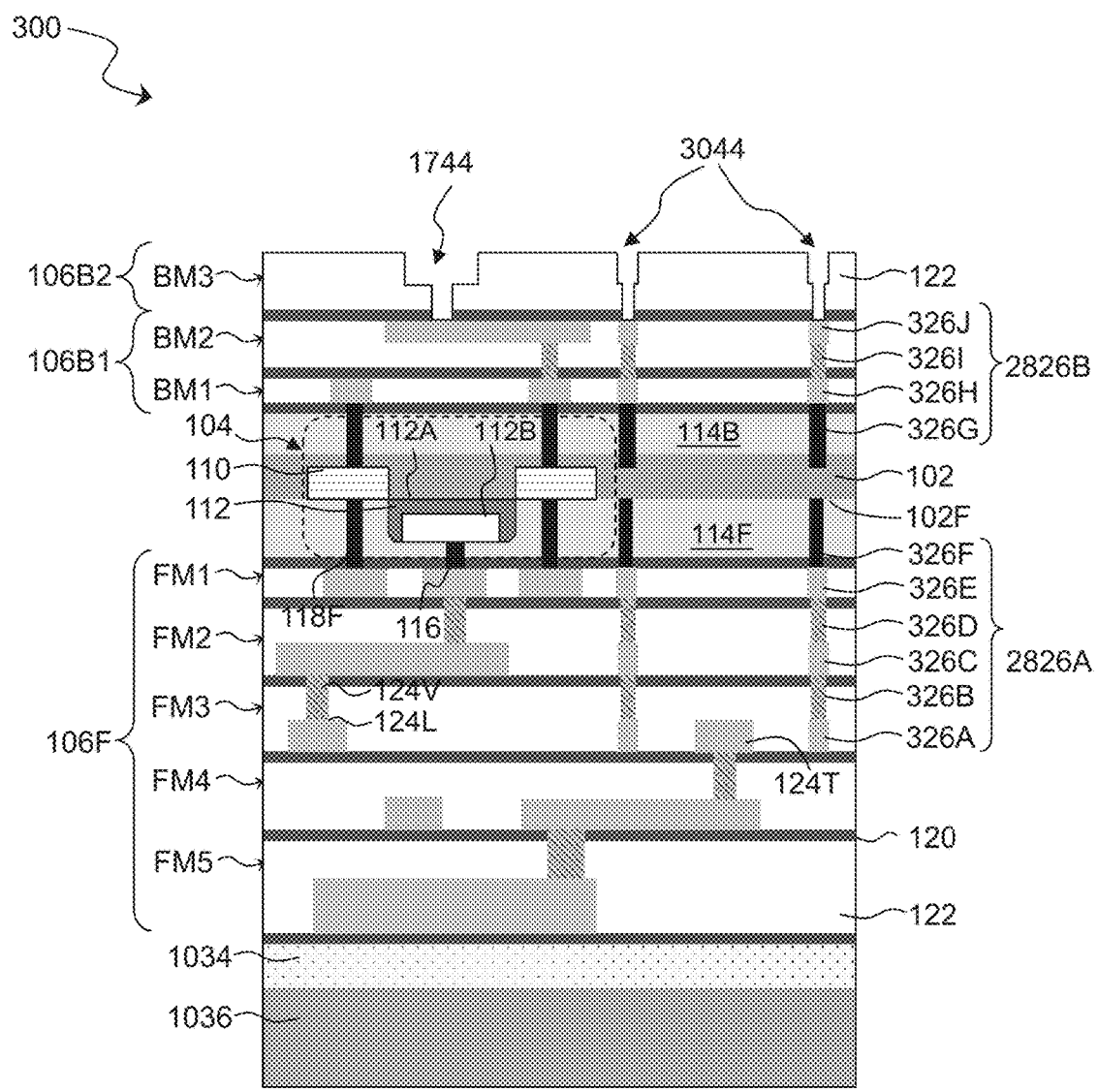
Figure 31:
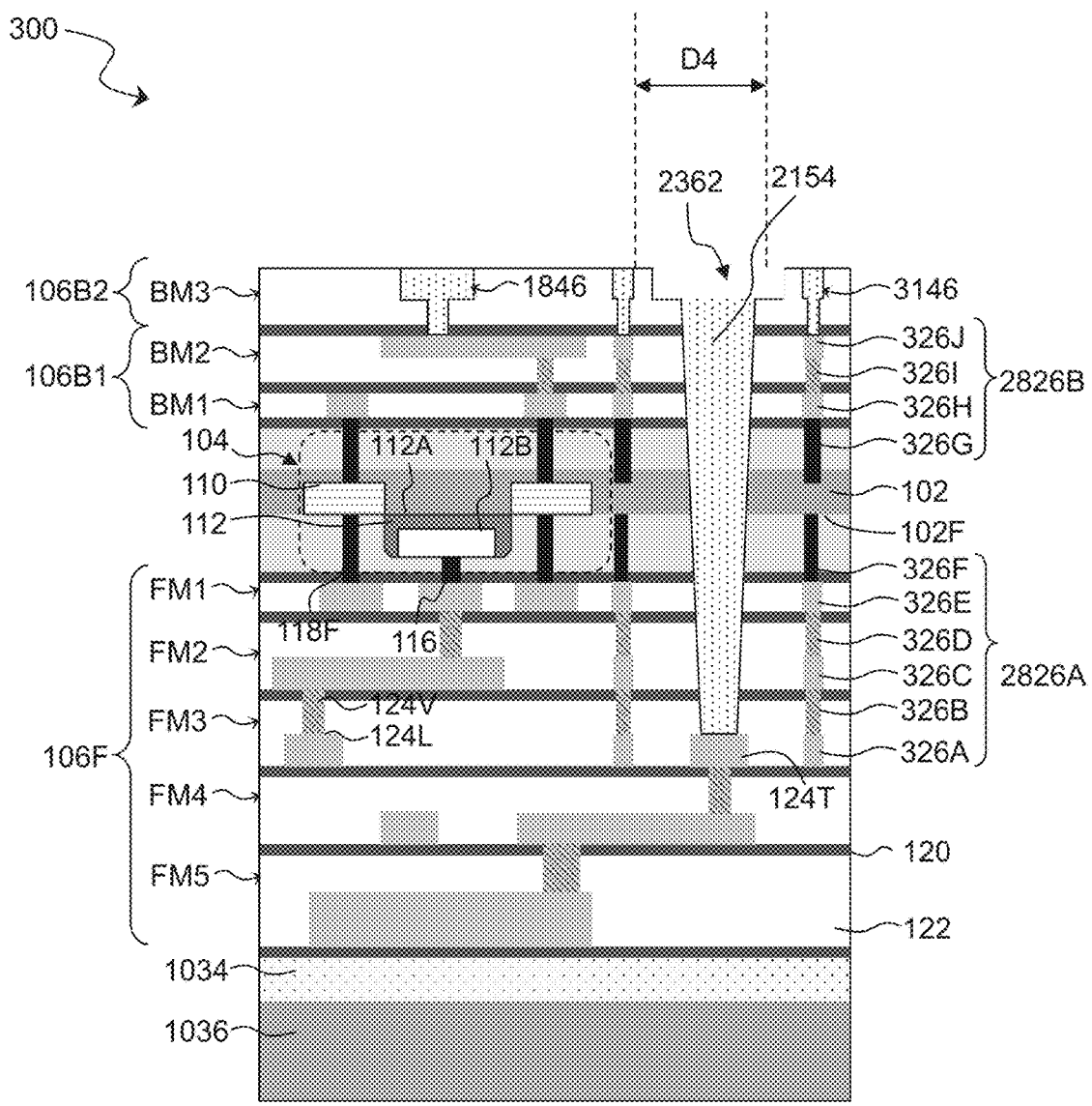

Polymer-filled DD structures 1846 and 3146 can be formed at the same time and with similar materials. The formation of polymer-filled DD structures 1846 and 3146 can include sequential operations of (i) depositing IMD layer 122 on the structure of FIG. 29, as shown in FIG. 30, (ii) forming openings 1744 and 3044 (also referred to as "DD openings 1744 and 3044") in a dual damascene process, as shown in FIG. 30, (iii) depositing a polymer layer (not shown) on the structure of FIG. 30 by a spin-coating process to fill openings 1744 and 3044, (iv) curing (also referred to as "hardening") the polymer layer by a thermal process, and (v) performing a CMP process on the cured polymer layer to form polymer-filled DD structures 1846 and 3146, as shown in FIG. 31. The polymer layer can include an organic material that is different from a photoresist material. In some embodiments, the polymer layer can include methacrylic acid, ethyl methacrylate, tert-butyl methacrylate, isobornyl methacrylate, or other suitable organic material.

Figure 32:
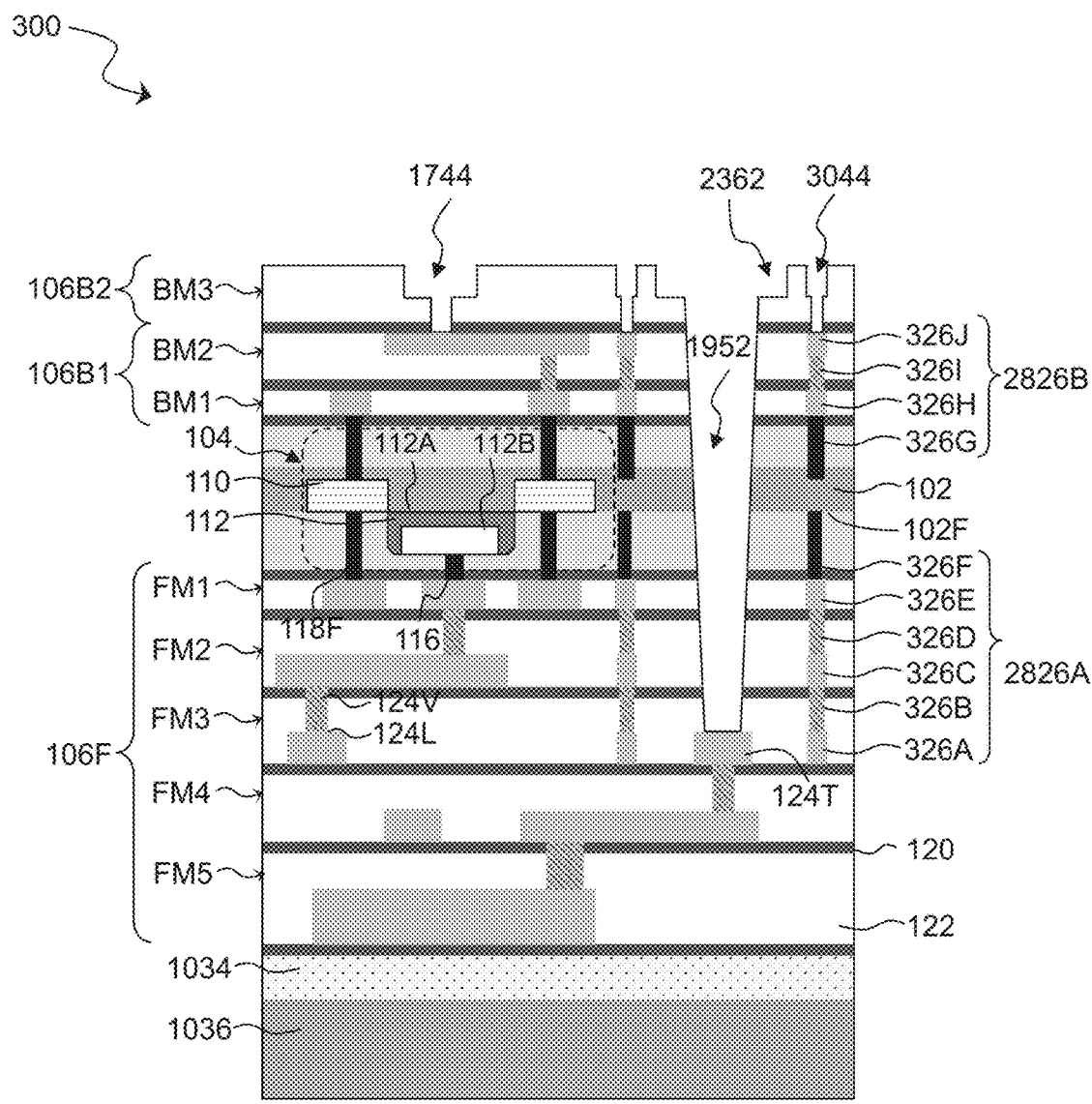

Referring to FIG. 27, in operation 2720, a DD structure including a TCV and a metal line of the second portion of the back interconnect structure is formed. For example, as described with reference to FIGS. 31-33, DD structure 2566 including metal line 124B and TCV 108 is formed in a dual damascene process. The formation of DD structure 2566 can include sequential operations of (i) forming polymer plug 2154 within opening 1952, as shown in FIG. 31, by operations similar to those described in operation 1620 with reference to FIGS. 19-21, (ii) forming a metal line opening 2362, as shown in FIG. 31, by operations similar to those described in operation 1620 with reference to FIGS. 22-23, (iii) removing polymer plug 2154 from opening 1952, as shown in FIG. 32, by operations similar to those described in operation 1620 with reference to FIG. 24, and (iv) forming liner 108A and conductive plug 108B within openings 1952 and 2362, as shown in FIG. 33, by operations similar to those described in operation 1620 with reference to FIG. 25.

Figure 33:
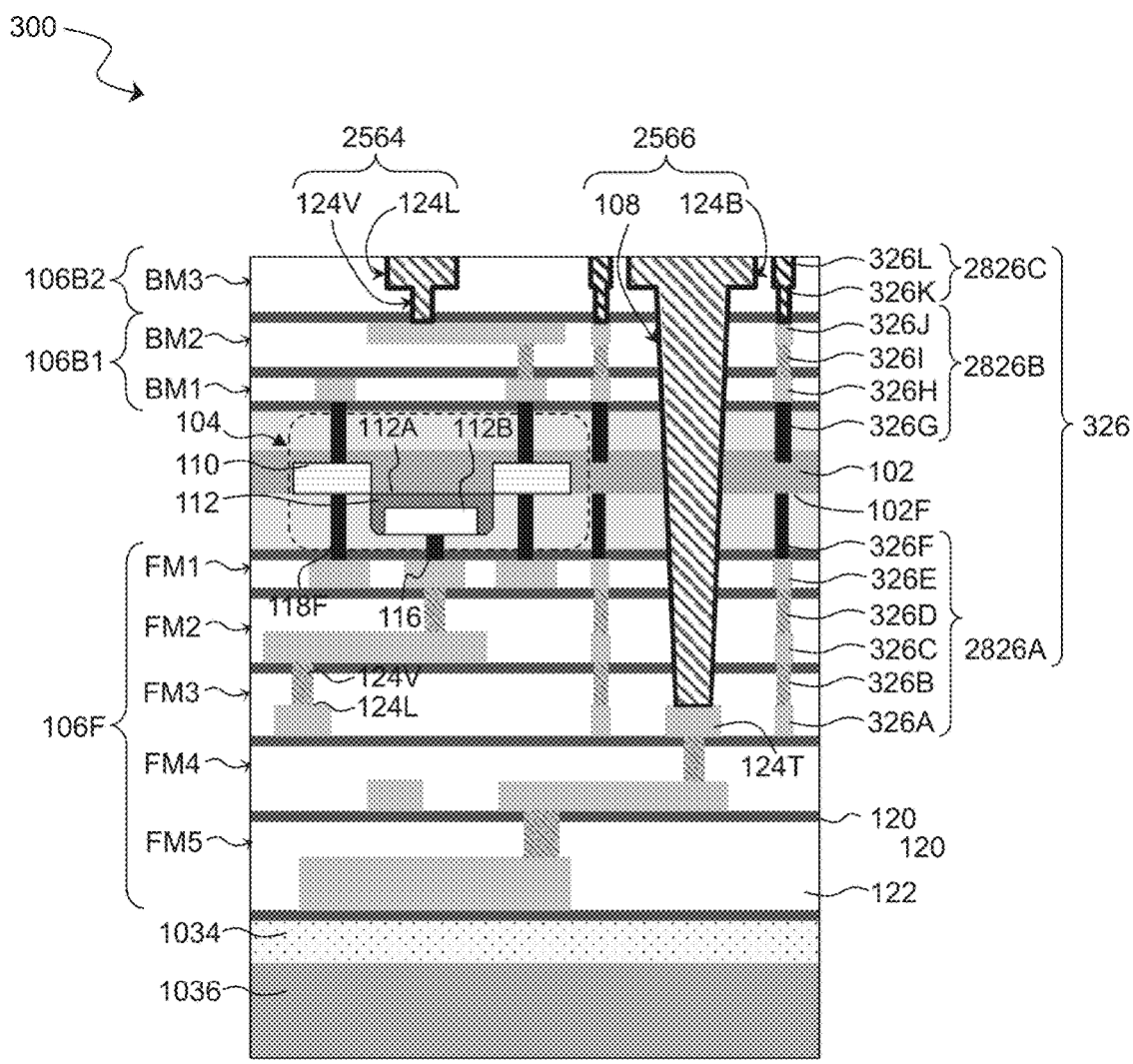

In some embodiments, polymer-filled DD structures 1846 and 3146 can be replaced with metal-filled DD structures 2564 and 2826C (shown in FIG. 33) during the formation of DD structure 2566 shown in FIG. 33. The replacement of polymer-filled DD structures 1846 and 3146 with metal-filled DD structures 2564 and 2826C can include sequential operations of (i) removing the polymer layer from openings 1744 and 3044 at the same time as removing polymer plug 2154, as shown in FIG. 32 and (ii) forming liner and conductive plug within openings 1744 and 3044 at the same time as forming liner 108A and conductive plug 108B, as shown in FIG. 33. In some embodiments, metal line 124 and metal via 124 may be absent from metallization layer BM3, and as a result, the operations of forming DD structure 2564 may not be performed in operation 2720.

Referring to FIG. 27, in operation 2725, a third portion of the back interconnect structure is formed on the DD structure and the second portion of the back interconnect structure. For example, third portion 106B3 of back interconnect structure 106B with metallization layer BM4, as shown in FIG. 26, can be formed on the structure of FIG. 33 by operations similar to those described in operation 1625. In some embodiments, bonding layer 1034 and carrier substrate 1036 can be removed after operation 2725.

Figure 34:
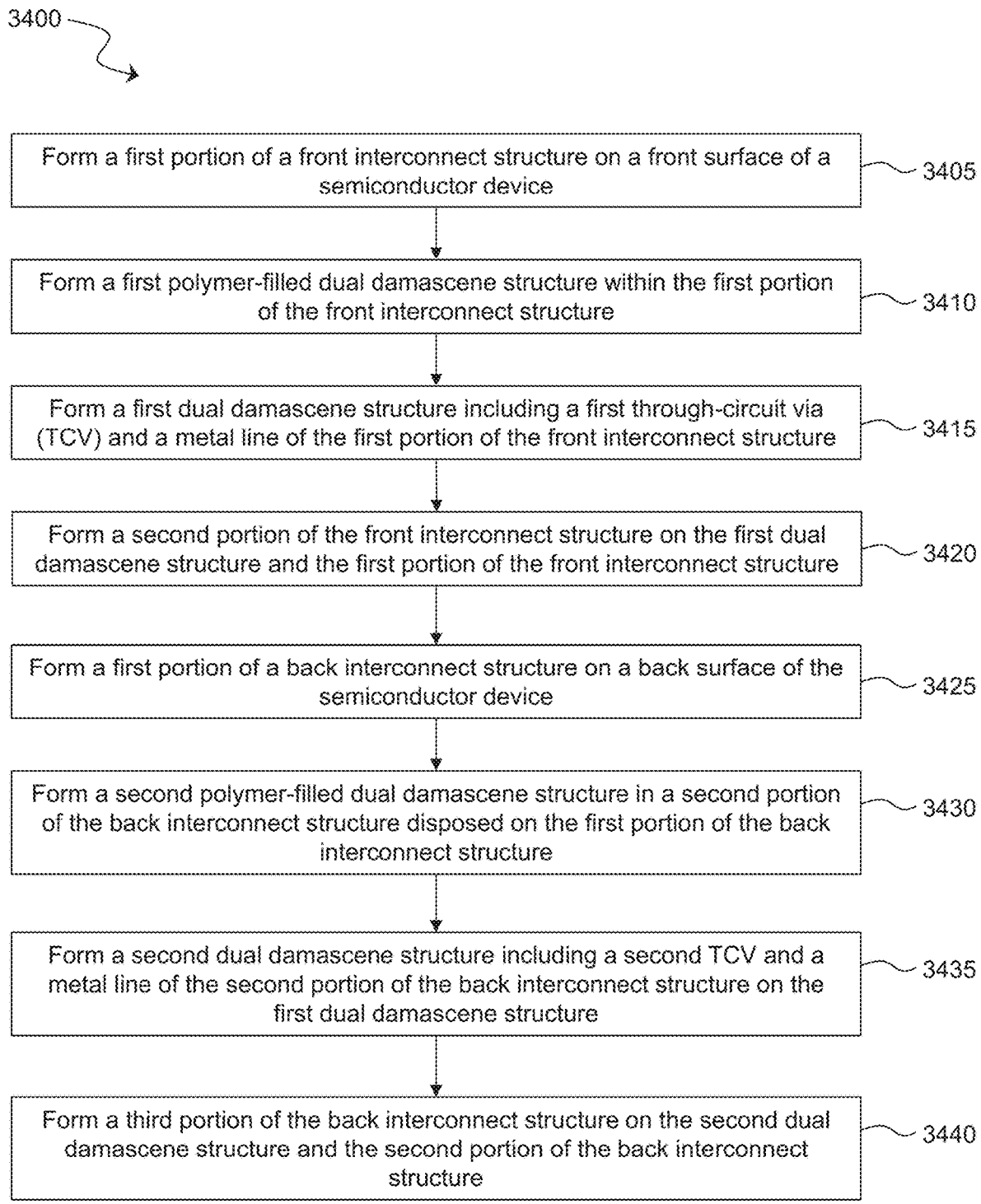
FIG. 34 is a flow diagram of a method for fabricating an IC with a TCV, in accordance with some embodiments.

FIG. 34 is a flow diagram of an example method 3400 for fabricating IC 800, according to some embodiments. For illustrative purposes, the operations illustrated in FIG. 34 will be described with reference to the example fabrication process for fabricating IC 800 as illustrated in FIGS. 35-40. FIGS. 35-40 are cross-sectional views of IC 800 at various stages of fabrication, according to some embodiments. Operations can be performed in a different order or not performed depending on specific applications. It should be noted that method 3400 may not produce a complete IC 800. Accordingly, it is understood that additional processes can be provided before, during, and after method 3400, and that some other processes may only be briefly described herein. Elements in FIGS. 35-40 with the same annotations as elements in FIGS. 1-9, 11-15, 17-26, and 28-33 are described above.

Figure 35:
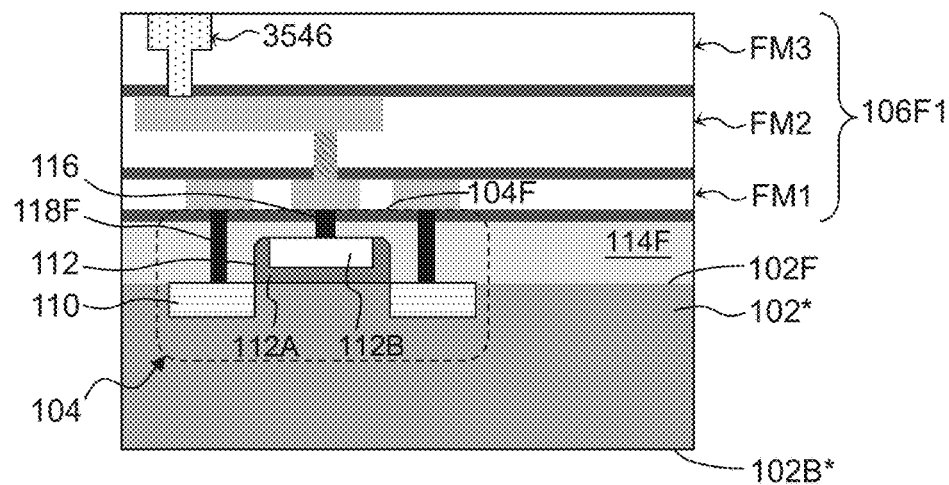
FIGS. 35-40 illustrate cross-sectional views of an IC with a TCV at various stages of its fabrication process, in accordance with some embodiments.
Figure 35:
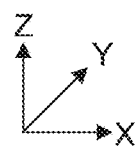

In operation 3405, a first portion of a front interconnect structure is formed on a front surface of a semiconductor device. For example, as shown in FIG. 35, a first portion 106F1 of front interconnect structure 106F is formed on front surface 104F of semiconductor structure 104, which is formed on front surface 102F of substrate 102*.

Referring to FIG. 34, in operation 3410, a first polymer-filled DD structure is formed within the first portion of the front interconnect structure. For example, as shown in FIG. 35, a polymer-filled DD structure 3546 is formed within first portion 106F1, which includes metallization layers FM1-FM3 of front interconnect structure 106F. The discussion of polymer-filled DD structure 1846 applies to first polymer-filled DD structure 3546, except first polymer-filled DD structure 3546 is formed in metallization layer FM3 and subsequently replaced with first metal-filled DD structure 3664 (shown in FIG. 36). In some embodiments, first polymer-filled DD structure 3546 can be formed by performing operations, on metallization layer FM3, similar to those described in operation 1615 with reference to FIGS. 17-18 for forming polymer-filled DD structure 1846.

Figure 36:
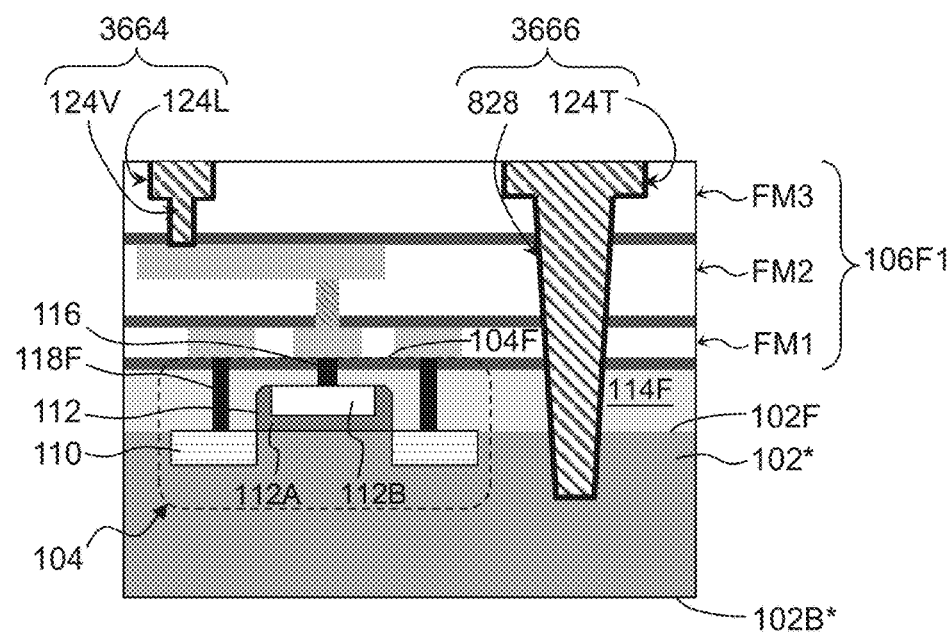

Referring to FIG. 34, in operation 3415, a first DD structure including a TCV and a metal line of the first portion of the front interconnect structure is formed. For example, as shown in FIG. 36, a first DD structure 3666 including TCV 828 and metal line 124T is formed within first portion 106F1, ILD layer 114F, and substrate 102* in a dual damascene process. In some embodiments, first DD structure 3666 can be formed by performing operations, on the structure of FIG. 35, similar to those described in operation 1620 with reference to FIGS. 19-25 for forming DD structure 2566.

Figure 37:
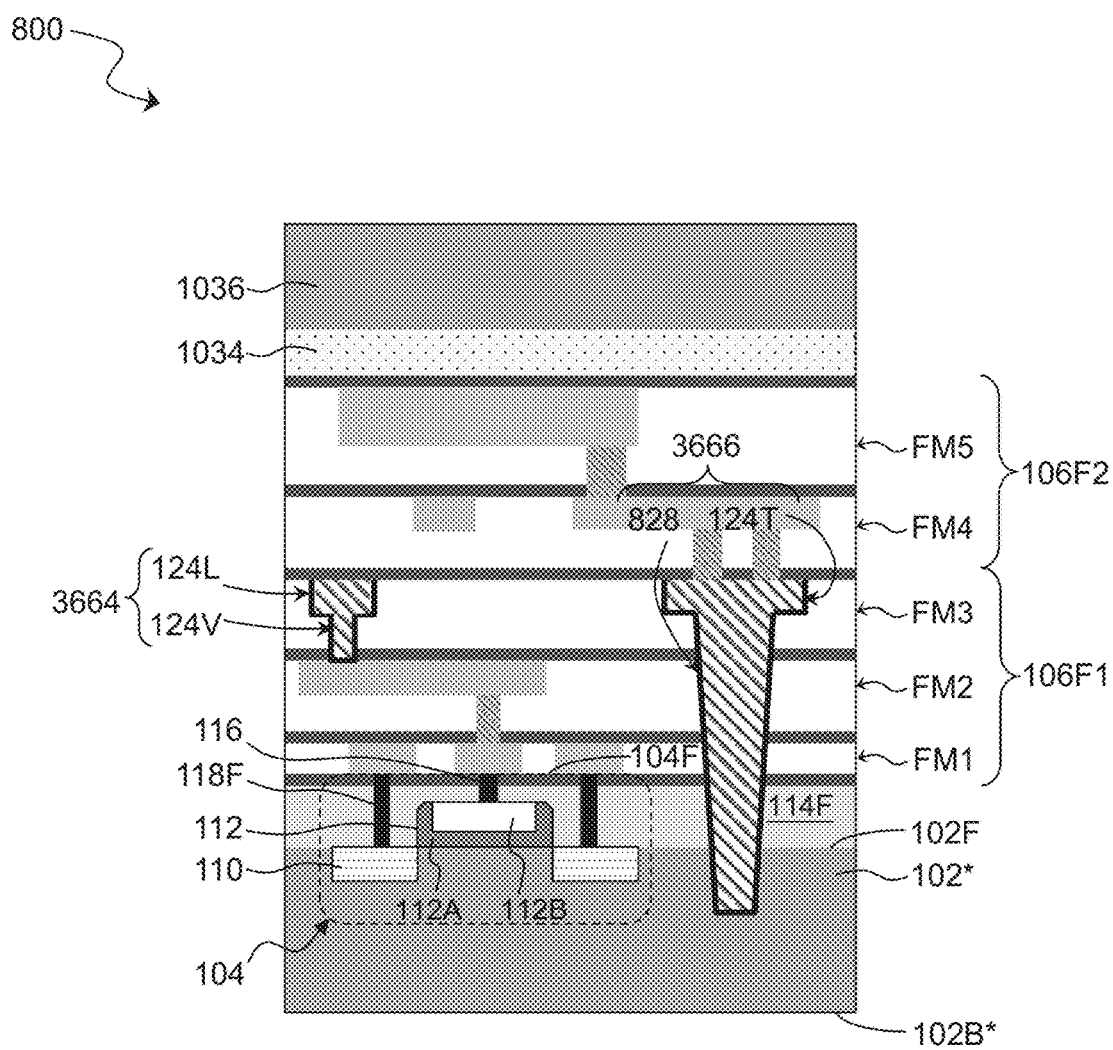

Referring to FIG. 34, in operation 3420, a second portion of the front interconnect structure is formed on the first DD structure and the first portion of the front interconnect structure. For example, as shown in FIG. 37, a second portion 106F2 of front interconnect structure 106F is formed on first DD structure 3666 and on first portion 106F1. Bonding layer 1034 and carrier substrate 1036 can be can be formed by performing operations, on second portion 106F2, similar to those described in operation 1005 with reference to FIG. 11.

Figure 38:
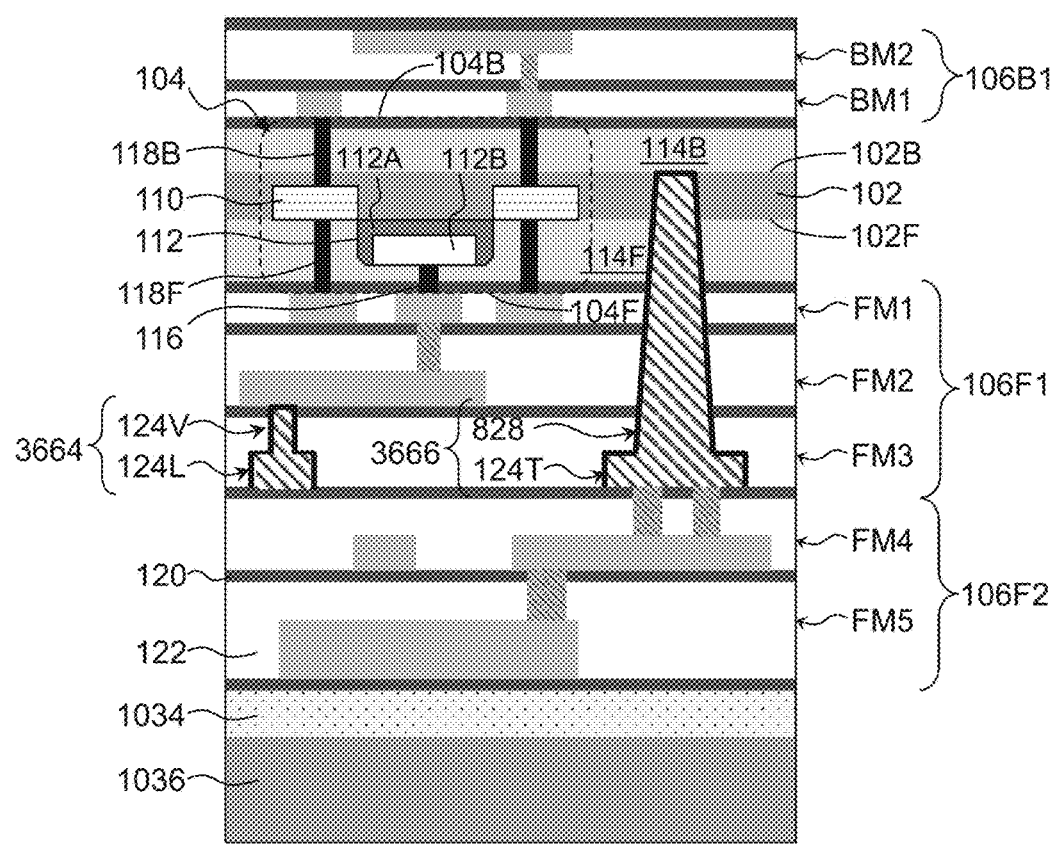

Referring to FIG. 34, in operation 3425, a first portion of a back interconnect structure is formed on a back surface of the semiconductor device. For example, as shown in FIG. 38, first portion 106B1 of back interconnect structure 106B is formed on back surface 104B of semiconductor device 104 by performing operations, on back surface 102B* of substrate 102* of FIG. 37, similar to those described in operation 1010 with reference to FIGS. 11-12.

Figure 39:
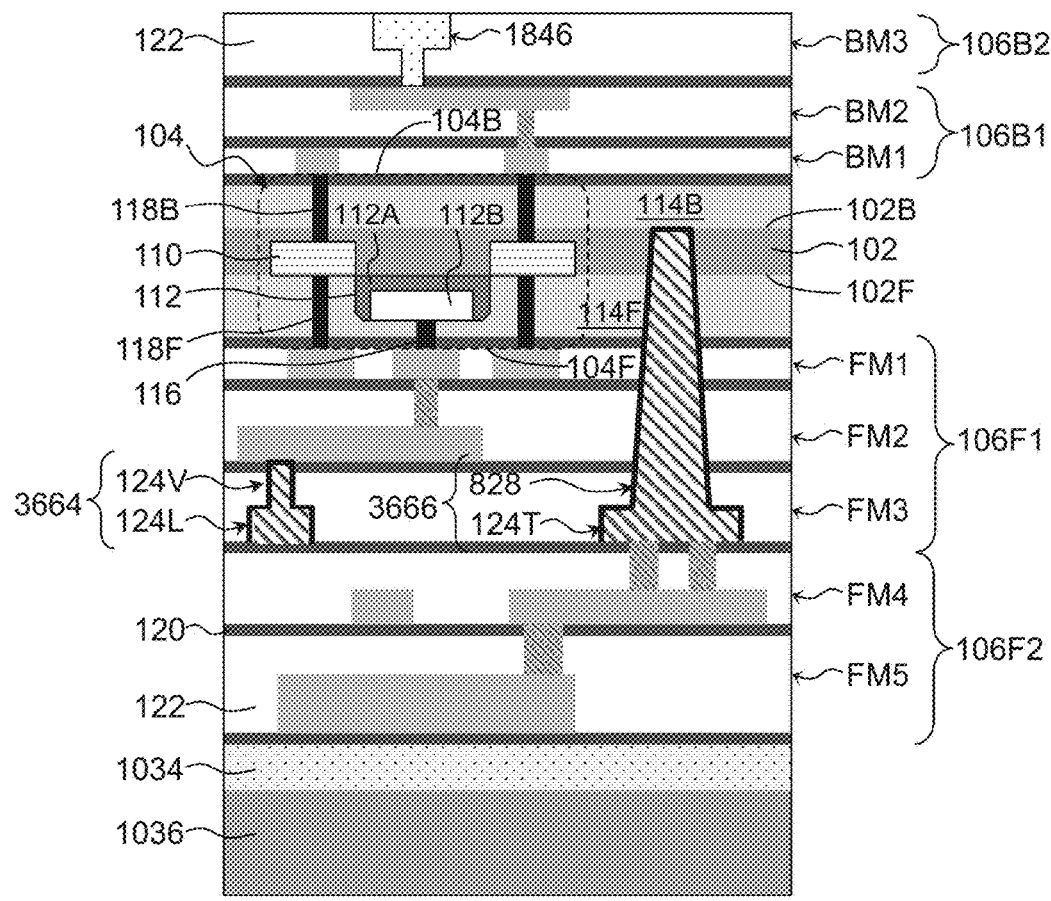

Referring to FIG. 34, in operation 3430, a second polymer-filled DD structure is formed in a second portion of the back interconnect structure disposed on the first portion of the back interconnect structure. For example, as shown in FIG. 39, a second polymer-filled DD structure 1846 is formed by operations similar to those described in operation 1615 with reference to FIGS. 17-18.

Figure 40:
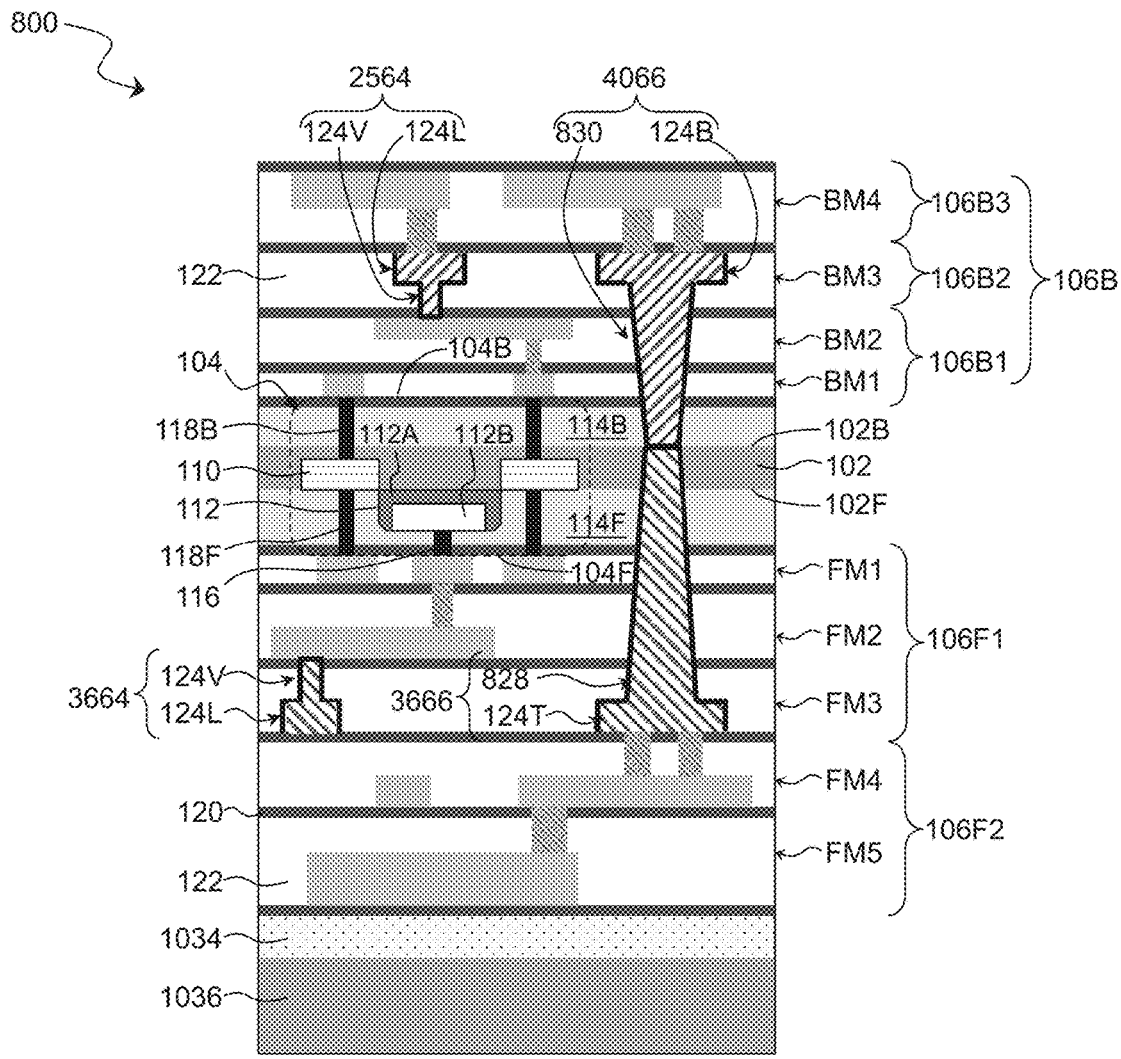

Referring to FIG. 34, in operation 3435, a second DD structure including a TCV and a metal line of the second portion of the back interconnect structure is formed on the first DD structure. For example, as shown in FIG. 40, a second DD structure 4066 including metal line 124B and TCV 830 is formed in a dual damascene process. In some embodiments, second DD structure 4066 can be formed by performing operations, on the structure of FIG. 39, similar to those described in operation 1620 with reference to FIGS. 19-25 for forming DD structure 2566. In some embodiments, second polymer-filled DD structure 1846 can be replaced with metal-filled DD structure 2564 during the formation of DD structure 4066, as shown in FIG. 40, by operations similar to those described in operation 1620 with reference to FIGS. 24-25 for replacing DD structure 1846 with DD structure 2564.

Referring to FIG. 34, in operation 3440, a third portion of the back interconnect structure is formed on the second DD structure and the second portion of the back interconnect structure. For example, third portion 106B3 of back interconnect structure 106B with metallization layer BM4 can be formed on second DD structure 4066, as shown in FIG. 40, by operations similar to those described in operation 1625. In some embodiments, bonding layer 1034 and carrier substrate 1036 can be removed after operation 3440.

Figure 41:
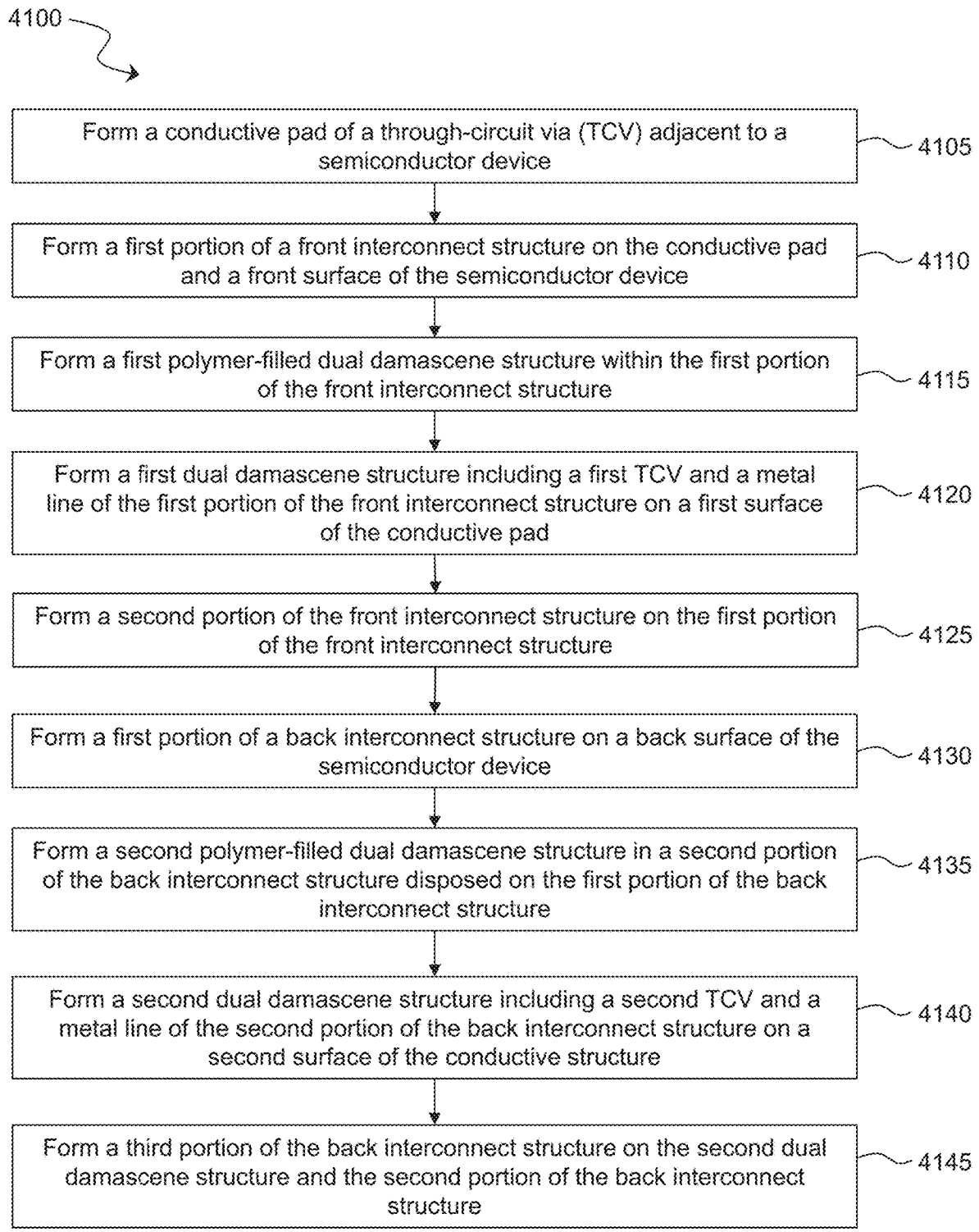
FIG. 41 is a flow diagram of a method for fabricating an IC with a TCV, in accordance with some embodiments.

FIG. 41 is a flow diagram of an example method 4100 for fabricating IC 900, according to some embodiments. For illustrative purposes, the operations illustrated in FIG. 41 will be described with reference to the example fabrication process for fabricating IC 900 as illustrated in FIGS. 42-47. FIGS. 42-47 are cross-sectional views of IC 900 at various stages of fabrication, according to some embodiments. Operations can be performed in a different order or not performed depending on specific applications. It should be noted that method 4100 may not produce a complete IC 900. Accordingly, it is understood that additional processes can be provided before, during, and after method 4100, and that some other processes may only be briefly described herein. Elements in FIGS. 42-47 with the same annotations as elements in FIGS. 1-9, 11-15, 17-26, 28-33, and 35-40 are described above.

Figure 42:
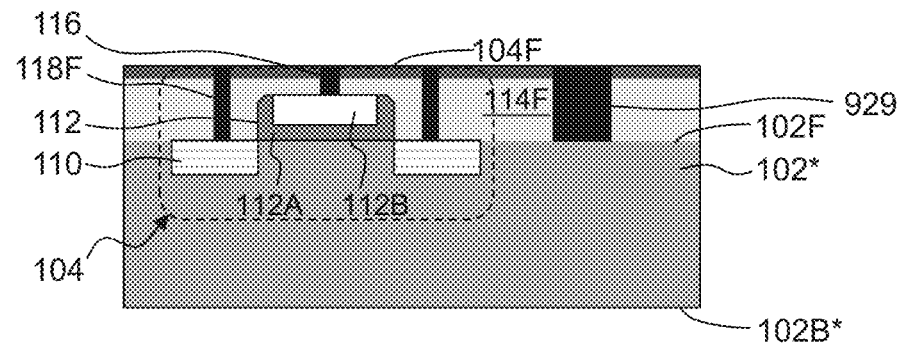
FIGS. 42-47 illustrate cross-sectional views of an IC with a TCV at various stages of its fabrication process, in accordance with some embodiments.

In operation 4105, a conductive pad of a TCV is formed adjacent to a semiconductor device. For example, as shown in FIG. 42, conductive pad 929 of TCV 909 (shown in FIG. 9) is formed adjacent to semiconductor structure 104, which is formed on front surface 102F of substrate 102*. In some embodiments, conductive pad 929 can be formed within front ILD layer 114F at the same time and with similar material as front S/D contact structures 118F.

Referring to FIG. 41, in operation 4110, a first portion of a front interconnect structure is formed on the conductive pad and a front surface of a semiconductor device. For example, as shown in FIG. 43, first portion 106F1 of front interconnect structure 106F is formed on conductive pad 929 and on front surface 104F of semiconductor structure 104.

Figure 43:
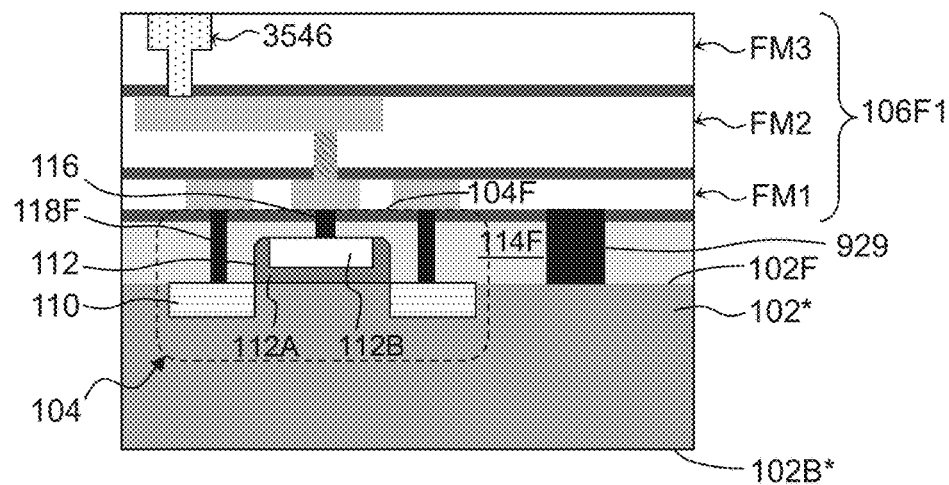

Referring to FIG. 41, similar to operation 3410, in operation 4115, first polymer-filled DD structure 3546 is formed within first portion 106F1 of front interconnect structure 106F, as shown in FIG. 43.

Figure 44:
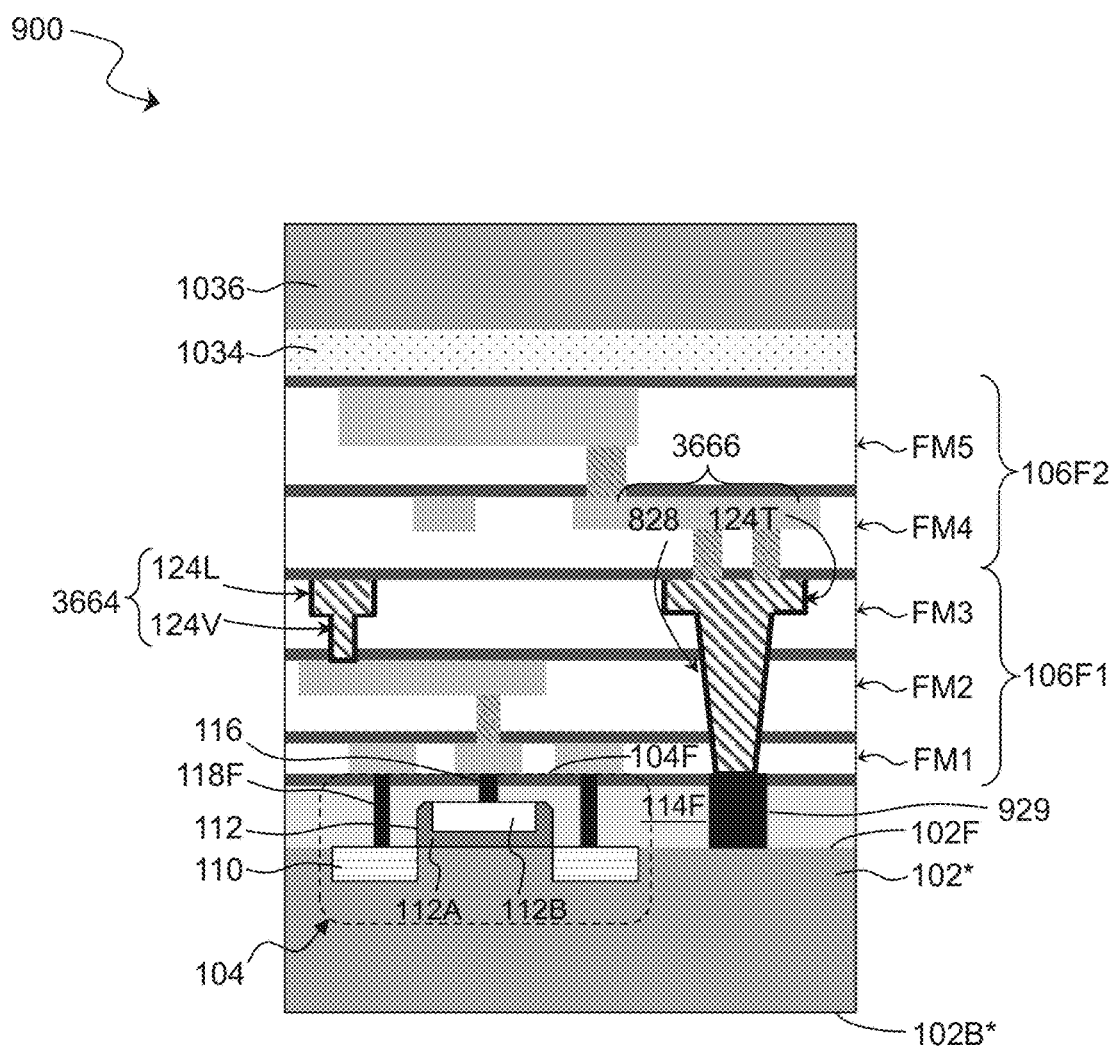

Referring to FIG. 41, in operation 4120, first DD structure 3666 including TCV 828 and metal line 124T of first portion 106F1 of front interconnect structure 106F is formed on a first surface of conductive pad 929, as shown in FIG. 44, by operations similar to those described in operation 3415.

Referring to FIG. 41, similar to operation 3420, in operation 4125, second portion 106F2 of front interconnect structure 106F is formed on first DD structure 3666 and first portion 106F1 of front interconnect structure 106F, as shown in FIG. 44.

Figure 45:
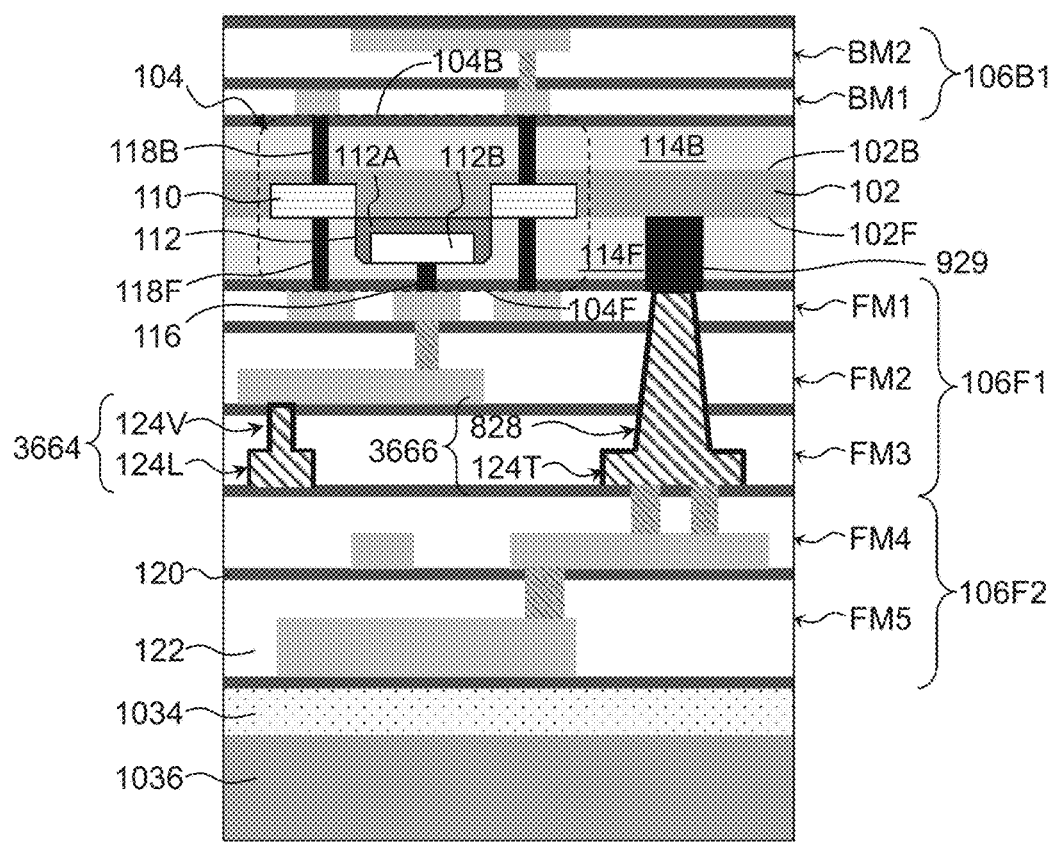

Referring to FIG. 41, similar to operation 3425, in operation 4130, first portion 106B1 of back interconnect structure 106B is formed on back surface 104B of semiconductor device 104, as shown in FIG. 45.

Figure 46:
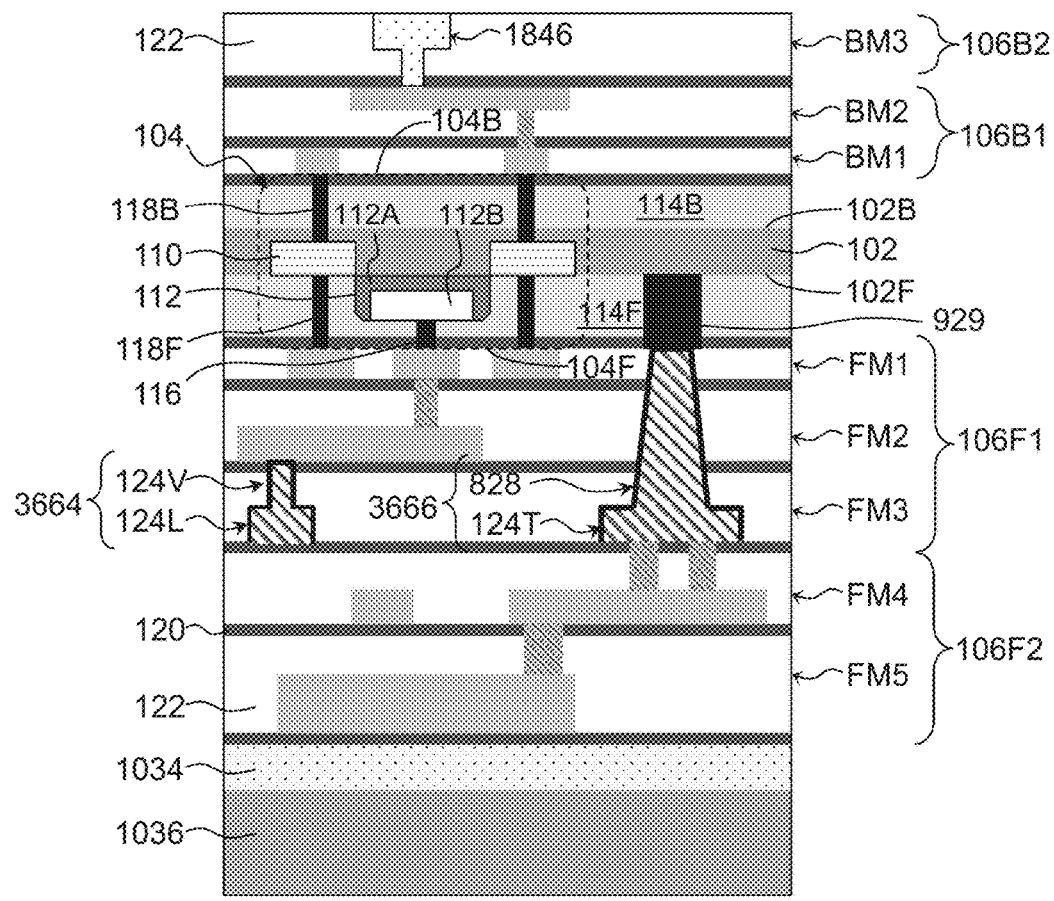

Referring to FIG. 41, similar to operation 3430, in operation 4135, second polymer-filled DD structure 1846 is formed in second portion 106B2 of back interconnect structure 106B disposed on first portion 106B1 of back interconnect structure 106B, as shown in FIG. 46.

Figure 47:
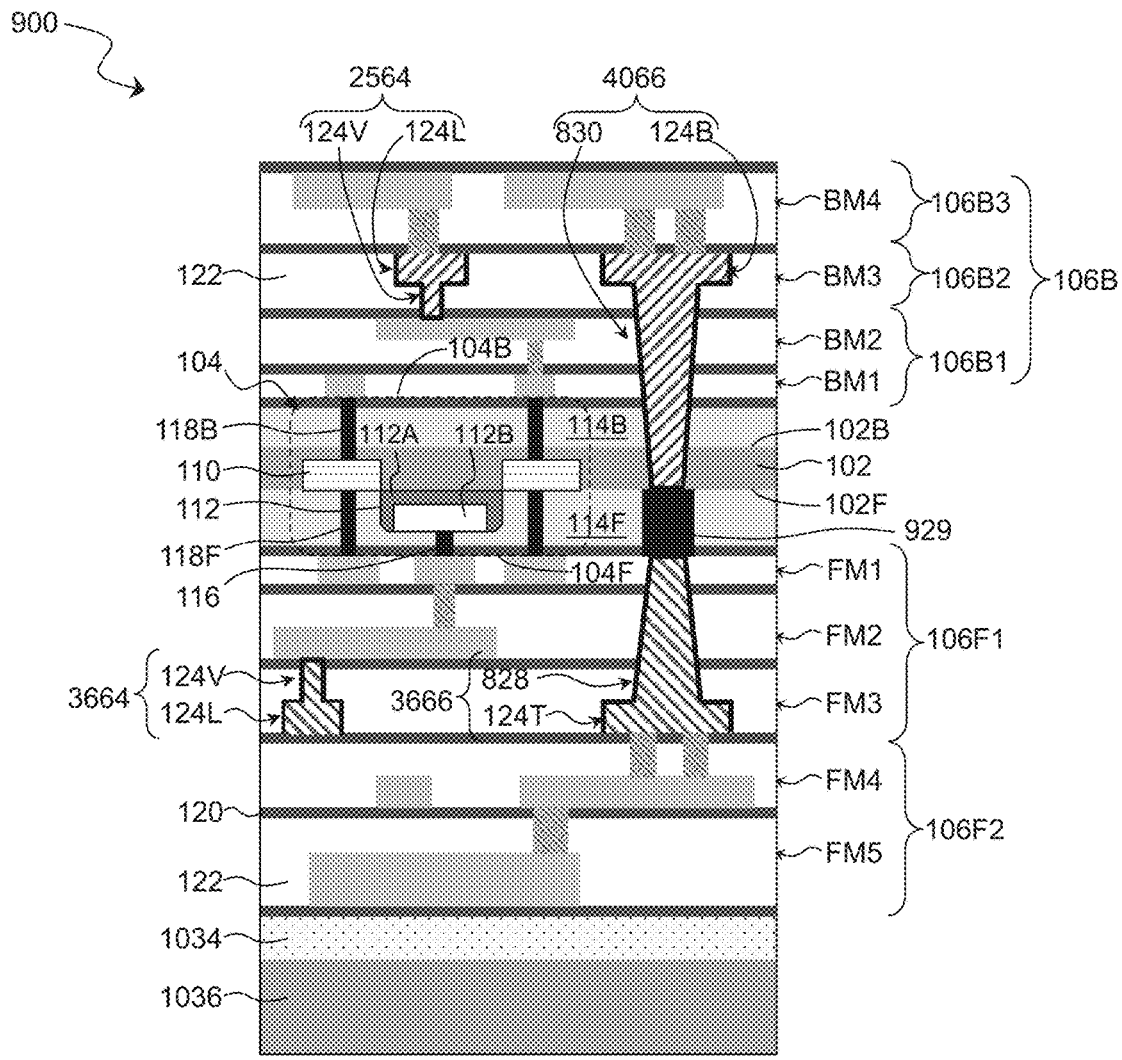

Referring to FIG. 41, in operation 4140, second DD structure 4066 including TCV 830 and metal line 124B of second portion 106B2 of back interconnect structure 106B is formed on a second surface of conductive pad 929, as shown in FIG. 47, by operations similar to those described in operation 3435.

Referring to FIG. 41, similar to operation 3440, in operation 4145, third portion 106B3 of back interconnect structure 106B is formed on second DD structure 4066 and second portion 106B2 of back interconnect structure 106B, as shown in FIG. 47.

The present disclosure provides example integrated circuits (ICs; e.g., ICs 100-300 and 800-900) with through-circuit vias (TCVs; e.g., TCV 108, 808, and 909) and provides methods (e.g., method 1000, 1600, 2700, 3400, and 4100) of fabricating the same. In some embodiments, the TCVs can extend through front and back interconnect structures (e.g., front and back interconnect structures 106F and 106B) disposed on respective front- and back surfaces of semiconductor devices (e.g., front and back surfaces 104F and 104B of semiconductor device 104) in the ICs and can be disposed adjacent to the semiconductor devices. The TCVs provide highly conductive and flexible routing between the front and back interconnect structures compared to routing provided between the front and back interconnect structures through the semiconductor devices. With the use of the TCVs, routings between front device structures (e.g., gate contact structures 112 or front S/D contact structures 118F), back device structures (e.g., back S/D contact structures 118B), and front- and back-side IC elements (e.g., power lines and/or signal lines) can be more flexible than the routings in ICs without TCVs. As a result, the routings from the front and back device structures are not limited to the front- and back-side elements, respectively, as in the case of ICs without TCVs. Such flexible routings through the TCVs provide flexibility in designing power lines and/or signal lines on either sides of the ICs without being restricted by the arrangement of the front and back device structures of the semiconductor devices.

In some embodiments, an IC includes a substrate with a front surface and a back surface opposite to the front surface and a semiconductor device with a first surface and a second surface opposite to the first surface disposed on the substrate. The first surface is disposed over the front surface of the substrate and the second surface is disposed over the back surface of the substrate. The IC further includes first and second interconnect structures disposed on the first and second surfaces of the semiconductor device, respectively, first and second ILD layers disposed on the front and back surfaces of the substrate, respectively, and a TCV disposed within the first and second interconnect structures, the first and second ILD layers, and the substrate. The TCV is spaced apart from the semiconductor device by a portion of the substrate and portions of the first and second ILD layers. A first end of the TCV, disposed over the front surface of the substrate, is connected to a conductive line of the first interconnect structure and a second end of the TCV, disposed over the back surface of the substrate, is connected to a conductive line of the second interconnect structure.

In some embodiments, an IC includes a substrate with a front surface and a back surface opposite to the front surface, a semiconductor device with a gate structure disposed on the front surface of the substrate, first and second interconnect structures disposed over the front and back surfaces of the substrate, respectively, a TCV disposed within the first and second interconnect structures, and a barrier structure, surrounding the TCV, disposed within the first and second interconnect structures. A first end of the TCV, disposed over the front surface of the substrate, is connected to a conductive line of the first interconnect structure and a second end of the TCV, disposed over the back surface of the substrate, is connected to a conductive line of the second interconnect structure.

In some embodiments, a method includes forming a semiconductor device with a gate structure disposed on a front surface of the substrate, forming a first interconnect structure over the front surface of the substrate, forming a first portion of a second interconnect structure over the back surface of the substrate, forming a through-circuit via (TCV) opening in the first interconnect structure and the first portion of the second interconnect structure, forming a conductive liner along sidewalls of the TCV opening, forming a conductive plug within the TCV opening, and forming a second portion of the second interconnect structure on the conductive plug.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC), comprising:
   a substrate with a front surface and a back surface opposite to the front surface;
   a semiconductor device with a first surface and a second surface opposite to the first surface disposed on the substrate, wherein the first surface is disposed on the front surface of the substrate and the second surface is disposed on the back surface of the substrate;
   first and second interconnect structures disposed on the first and second surfaces of the semiconductor device, respectively;
   first and second inter-layer dielectric (ILD) layers disposed on the front and back surfaces of the substrate, respectively; and
   a through-circuit via (TCV) disposed in the first and second interconnect structures, the first and second ILD layers, and the substrate,
   wherein the TCV is spaced apart from the semiconductor device by a portion of the substrate and portions of the first and second ILD layers,
   wherein a first end of the TCV is connected to a conductive line of the first interconnect structure and a second end of the TCV is connected to a conductive line of the second interconnect structure, and
   wherein the TCV and the conductive line of the second interconnect structure is a dual damascene structure.

2. The IC of claim 1, wherein a diameter of the second end of the TCV is greater than a diameter of the first end of the TCV.

3. The IC of claim 1, wherein a ratio between a diameter of the first end of the TCV and a width of the conductive line of the first interconnect structure ranges from about 1:1 to about 1:10.

4. The IC of claim 1, wherein a ratio between a diameter of the second end of the TCV and a width of the conductive line of the second interconnect structure ranges from about 1:1 to about 1:10.

5. The IC of claim 1, wherein a ratio between a diameter of the second end of the TCV and a width of a contact structure of the semiconductor device ranges from about 1:1 to about 50:1.

6. The IC of claim 1, wherein a distance between the TCV and a gate structure of the semiconductor device is about 3 times to about 50 times greater than a diameter of the second end of the TCV.

7. The IC of claim 1, wherein the TCV comprises a conductive liner and a conductive plug disposed on the conductive liner.

8. The IC of claim 1, wherein a gate structure of the semiconductor device is electrically connected to an other conductive line of the second interconnect structure through the TCV.

9. The IC of claim 1, wherein the semiconductor device comprises a source/drain region and a contact structure disposed on the source/drain region through the back surface of the substrate, and
   wherein the contact structure is electrically connected to an other conductive line of the first interconnect structure through the TCV.

10. The IC of claim 1, wherein the TCV comprises a first TCV and a second TCV disposed on the first TCV.

11. The IC of claim 1, wherein the TCV comprises first and second TCVs and a conductive pad disposed between the first and second TCVs.

12. A structure, comprising:
    a device layer comprising a semiconductor device with a first surface and a second surface opposite to the first surface;
    a first interconnect structure disposed on the first surface of the semiconductor device;
    a second interconnect structure disposed on the second surface of the semiconductor device; and
    a via extending through the device layer and the first and second interconnect structures,
    wherein a first end of the via is connected to a conductive line of the first interconnect structure and a second end of the via is connected to a conductive line of the second interconnect structure, and
    wherein the via and the conductive line of the second interconnect structure is a dual damascene structure.

13. The structure of claim 12, wherein the via comprises a stack of first and second vias, and
    wherein an interface between the first and second vias is disposed on the second surface of the device layer.

14. The structure of claim 12, wherein the via comprises a stack of first and second vias, and
    wherein tapered ends of the first and second vias are in physical contact with each other.

15. The structure of claim 12, wherein the via comprises first and second vias and a conductive pad disposed between the first and second vias.

16. A structure, comprising:
 a substrate comprising first and second surfaces;
 a semiconductor device comprising:
  a source/drain region disposed in the substrate, and
  a contact structure disposed on the source/drain region;
 first and second interconnect structures disposed on the first and second surfaces of the substrate, respectively; and
 a via extending from a conductive line of the first interconnect structure to a conductive line of the second interconnect structure, wherein the via comprises a conductive pad on a same surface level as the contact structure and wherein the via and the conductive line of the second interconnect structure is a dual damascene structure.

17. The structure of claim 16, wherein the via further comprises first and second vias disposed on the conductive pad.

18. The structure of claim 16, wherein the conductive pad and the contact structure comprises similar material.

19. The structure of claim 16, wherein a ratio between a diameter of an end of the via and a width of the contact structure is about 1:1 to about 50:1.

20. The structure of claim 16, wherein the via comprises first and second vias, and wherein the conductive pad is disposed between the first and second vias.

\* \* \* \* \*